United States Patent
Kim et al.

(10) Patent No.: US 12,400,724 B2
(45) Date of Patent: Aug. 26, 2025

(54) VOLTAGE GENERATION CIRCUIT AND SEMICONDUCTOR MEMORY DEVICE INCLUDING THE SAME

(71) Applicant: SAMSUNG ELECTRONICS CO., LTD., Suwon-si (KR)

(72) Inventors: Yumin Kim, Suwon-si (KR); Jungyu Lee, Suwon-si (KR); Jihyun Park, Suwon-si (KR); Chiweon Yoon, Suwon-si (KR); Eunchan Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 193 days.

(21) Appl. No.: 18/241,621

(22) Filed: Sep. 1, 2023

(65) Prior Publication Data
US 2024/0274212 A1    Aug. 15, 2024

(30) Foreign Application Priority Data
Feb. 15, 2023    (KR) .................. 10-2023-0019865

(51) Int. Cl.
*G11C 7/04* (2006.01)
*G11C 29/02* (2006.01)
*G11C 29/12* (2006.01)

(52) U.S. Cl.
CPC .......... *G11C 29/12005* (2013.01); *G11C 7/04* (2013.01); *G11C 29/028* (2013.01); *G11C 29/1201* (2013.01)

(58) Field of Classification Search
CPC ... G11C 29/12005; G11C 7/04; G11C 29/028; G11C 29/1201; G11C 29/021; G11C 29/50012; G11C 5/147; G11C 7/12; G11C 11/4074; G11C 16/30; G11C 11/4085; G11C 11/4094; G11C 16/08; G11C 16/24; G05F 1/567
See application file for complete search history.

(56) References Cited

U.S. PATENT DOCUMENTS 8,284,624 B2    10/2012   Kim et al.
8,710,898 B1    4/2014    Chiang et al.
(Continued)

FOREIGN PATENT DOCUMENTS

JP    2022-54053 A    4/2022

*Primary Examiner* — Mohammed A Bashar
(74) *Attorney, Agent, or Firm* — Sughrue Mion, PLLC

(57) ABSTRACT

A voltage generation circuit includes a current generation circuit, a slope trimming circuit and an offset trimming circuit. The current generation circuit is connected between an input voltage node and an output node that outputs a complementary to absolute temperature (CTAT) output voltage that decreases as an operation temperature increases. The current generation circuit generates a reference current flowing through the output node, the reference current having a constant magnitude regardless of the operation temperature. The slope trimming circuit is connected between the output node and an intermediate node. The slope trimming circuit adjusts a slope of the CTAT output voltage based on a first trimming code. The offset trimming circuit is connected between the intermediate node and a ground voltage node. The offset trimming circuit configured to adjust an offset voltage of the CTAT output voltage based on a second trimming code.

20 Claims, 27 Drawing Sheets

(56) References Cited

U.S. PATENT DOCUMENTS

| | | |
|---|---|---|
| 9,600,014 B2 | 3/2017 | Marinca et al. |
| 10,191,507 B1 | 1/2019 | Kim et al. |
| 10,379,566 B2 | 8/2019 | Acar et al. |
| 10,612,981 B2 | 4/2020 | Kim et al. |
| 11,099,594 B1 | 8/2021 | Kanoun |
| 2008/0030259 A1* | 2/2008 | Scheuerlein ............ G01K 15/00 327/513 |
| 2019/0044528 A1* | 2/2019 | Lu ............................ G01K 7/14 |
| 2019/0199330 A1* | 6/2019 | Roy ....................... H03K 4/502 |

* cited by examiner

VOLTAGE GENERATION CIRCUIT AND SEMICONDUCTOR MEMORY DEVICE INCLUDING THE SAME

CROSS-REFERENCE TO RELATED APPLICATION

This U.S. non-provisional application claims priority under 35 USC § 119 to Korean Patent Application No. 10-2023-0019865, filed on Feb. 15, 2023, in the Korean Intellectual Property Office (KIPO), the disclosure of which being incorporated by reference herein in its entirety.

BACKGROUND

Example embodiments relate generally to semiconductor integrated circuits, and more particularly to a voltage generation circuit and a semiconductor memory device including the voltage generation circuit.

A semiconductor device such as a NAND flash memory device or a dynamic random access memory (DRAM) device has a characteristic in that cell current decreases as the operation temperature decreases. Therefore, when a read operation and/or a write operation is performed at a low temperature, a higher voltage must be applied to the wordline and/or the bitline to compensate for the decreasing cell current to ensure normal operations.

Compensating the applied voltage according to the temperature characteristics of the memory cell as described above is called 'temperature compensation', and for the temperature compensation, the generation of a complementary to absolute temperature (CTAT) voltage linear to the temperature is required.

SUMMARY

It is an aspect to provide a voltage generation circuit and a semiconductor memory device including the voltage generation circuit, capable of generating a CTAT output voltage with enhanced linearity.

According to an aspect of one or more example embodiments, a voltage generation circuit includes a current generation circuit, a slope trimming circuit and an offset trimming circuit. The current generation circuit is connected between an input voltage node and an output node that outputs a complementary to absolute temperature (CTAT) output voltage that decreases as an operation temperature increases. The current generation circuit generates a reference current flowing through the output node, the reference current having a constant magnitude regardless of the operation temperature. The slope trimming circuit is connected between the output node and an intermediate node. The slope trimming circuit adjusts a slope of the CTAT output voltage based on a first trimming code. The offset trimming circuit is connected between the intermediate node and a ground voltage node. The offset trimming circuit configured to adjust an offset voltage of the CTAT output voltage based on a second trimming code.

According to another aspect of one or more example embodiments, a semiconductor memory device includes a memory cell array including a plurality of memory cells respectively connected to a plurality of wordlines and a plurality of bitlines; and a voltage generator including a voltage generation circuit, the voltage generator configured to output voltages to drive the plurality of wordlines, the voltages being based on a complementary to absolute temperature (CTAT) output voltage that decreases as an operation temperature increases. The voltage generation circuit includes a current generation circuit connected between an input voltage node and an output node that outputs the CTAT output voltage, the current generation circuit configured to generate a reference current flowing through the output node, the reference current having a constant magnitude regardless of the operation temperature; a slope trimming circuit connected between the output node and an intermediate node, the slope trimming circuit configured to adjust a slope of the CTAT output voltage based on a first trimming code; and an offset trimming circuit connected between the intermediate node and a ground voltage node, the offset trimming circuit configured to adjust an offset voltage of the CTAT output voltage based on a second trimming code.

According to yet another aspect of one or more example embodiments, a voltage generation circuit includes a first bias voltage generation circuit configured to generate a first bias voltage that increases as an operation temperature increases; a second bias voltage generation circuit configured to generate a second bias voltage that decreases as the operation temperature increases; a first current source connected between an input voltage node and an output node, the first current source configured to generate a first current based on the first bias voltage, the first current increasing as the operation temperature increases; a second current source connected in parallel to the first current source between the input voltage node and the output node, the second current source configured to generate a second current based on the second bias voltage, the second current decreasing as the operation temperature increases; a plurality of diode-connected transistors connected in parallel between the output node and an intermediate node; a plurality of first switches connected between the output node and respective ones of the plurality of diode-connected transistors and being turned on based on respective bits of a first trimming code; a plurality of resistors connected in series between the intermediate node and a ground voltage node; and a plurality of second switches connected in parallel with respective ones of the plurality of resistors and being turned on based on respective bits of a second trimming code.

BRIEF DESCRIPTION OF THE DRAWINGS

Various example embodiments will be more clearly understood from the following detailed description taken in conjunction with the accompanying drawings.

DETAILED DESCRIPTION

Figure 1:
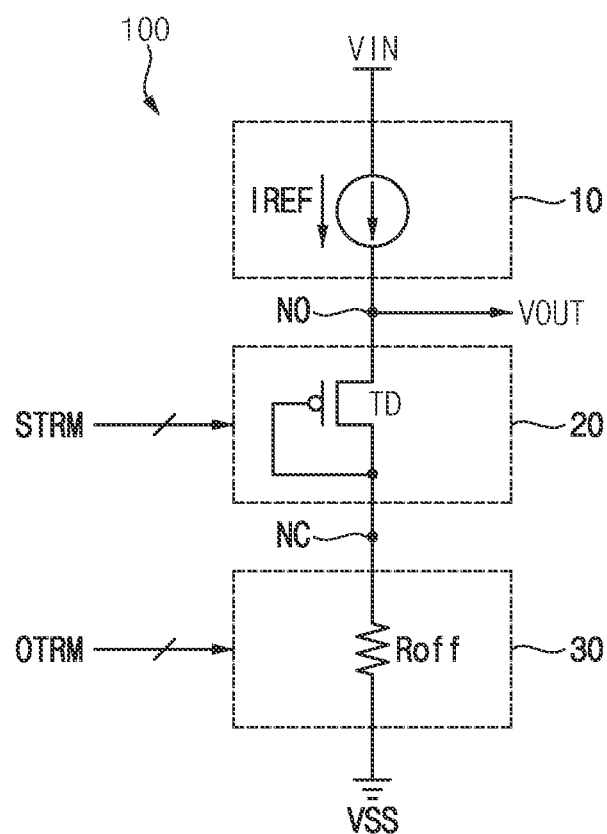
FIG. 1 is a diagram illustrating a voltage generation circuit according to example embodiments.

Various example embodiments will be described more fully hereinafter with reference to the accompanying drawings, in which some example embodiments are shown. In the drawings, like numerals refer to like elements throughout. The repeated descriptions may be omitted.

The voltage generation circuit according to example embodiments may generate the CTAT output voltage with enhanced linearity using a reference current having a constant magnitude irrespective of the operation temperature. Through the CTAT output voltage with enhanced linearity, it is possible to reduce an operation variation due to a change in an operation temperature of a semiconductor device such as a semiconductor memory device, and efficiently trim the operation variation of each device according to a manufacturing process. The performance of the semiconductor device may be improved and a low-voltage design of the semiconductor device may be promoted through the reduction of the operation deviation.

FIG. 1 is a diagram illustrating a voltage generation circuit according to example embodiments.

Referring to FIG. 1, a voltage generation circuit 100 may include a current generation circuit 10, a slope trimming circuit 20 and an offset trimming circuit 30.

The current generation circuit 10 may be connected between an input voltage node to which an input voltage VIN is applied and an output node NO that outputs a complementary to absolute temperature (CTAT) output voltage VOUT that decreases as an operation temperature increases. The current generation circuit 10 may generate a reference current IREF that flows through the output node NO such that the reference current IREF may have a constant magnitude regardless of the operation temperature.

In some example embodiments, as will be described below with reference to FIG. 2, the current generation circuit 10 may generate the reference current IREF having the constant magnitude by summing a first current having a characteristic proportional to an absolute temperature (PTAT) and a second current having a characteristic of the CTAT.

The slope trimming circuit 20 may be connected between the output node NO and an intermediate node NC. The slope trimming circuit 20 may adjust a slope of the CTAT output voltage VOUT based on a first trimming code STRM.

In some example embodiments, the slope trimming circuit 20 may be implemented as an equivalent circuit of a diode-connected transistor TD as illustrated in FIG. 1. In this case, as will be described below with reference to FIGS. 4 and 5, a drain-source voltage (i.e., the voltage between the output node NO and the intermediate node NC) of the diode-connected transistor TD may correspond to a threshold voltage VTH of the diode-connected transistor TD and the threshold voltage VTH may have the CTAT characteristics such that the threshold voltage VTH may decrease as the operation temperature To increases.

The offset trimming circuit 30 may be connected between the intermediate node NC and a ground voltage node to which a ground voltage VSS is applied. The offset trimming circuit 30 may adjust an offset voltage VOFS (see FIG. 7) of the CTAT output voltage VOUT based on a second trimming code OTRM. The offset voltage VOFS may correspond to the voltage at the intermediate node NC when the ground voltage VSS is zero.

In some example embodiments, the offset trimming circuit 30 may be implemented as an equivalent circuit of a resistor Roff as illustrated in FIG. 1. In this case, as will be described below with reference to FIG. 5, the voltage at the intermediate node NC, that is, the offset voltage VOFS may correspond to a voltage drop through the resistor Roff, and the voltage drop corresponds to a multiplication of the reference current IREF and the resistance of the resistor Roff. The offset voltage VOFS may have a constant magnitude regardless of the operation temperature if the reference current IREF has a constant magnitude regardless of the operation temperature To.

As such, the voltage generation circuit 100 according to example embodiments may generate the CTAT output voltage VOUT with enhanced linearity using the reference current IREF having the constant magnitude regardless of the operation temperature To.

Figure 2:
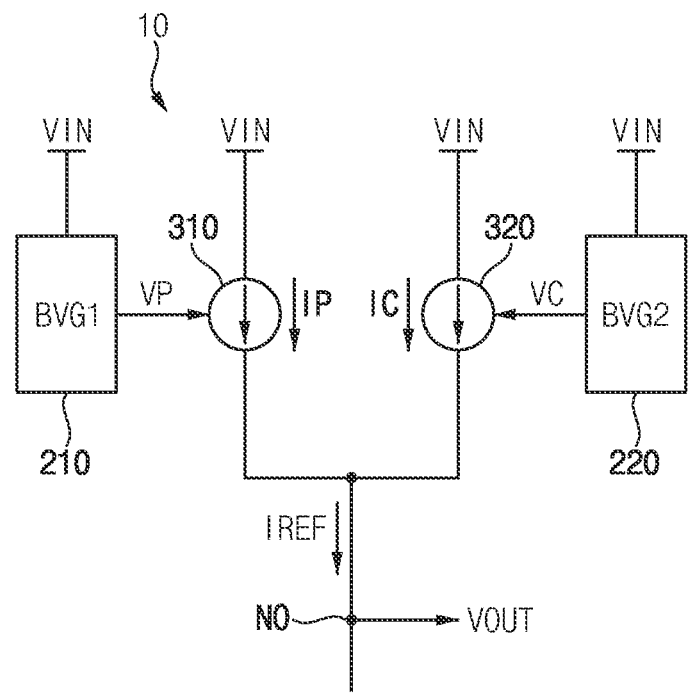
FIG. 2 is a block diagram illustrating an example of a current generation circuit included in a voltage generation circuit according to example embodiments.
Figure 3:
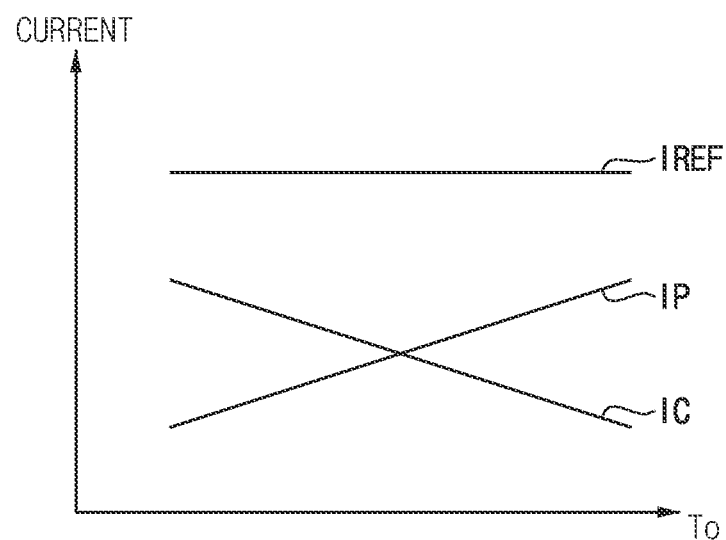
FIG. 3 is a diagram illustrating currents generated by the current generation circuit of FIG. 2, according to example embodiments.

FIG. 2 is a block diagram illustrating an example of a current generation circuit included in a voltage generation circuit according to example embodiments, and FIG. 3 is a diagram illustrating currents generated by the current generation circuit of FIG. 2, according to example embodiments.

Referring to FIG. 2, the current generation circuit 10 may include a first bias voltage generation circuit BVG1 210, a second bias voltage generation circuit BVG2 220, a first current source 310 and a second current source 320.

The first bias voltage generation circuit 210 may generate a first bias voltage VP that increases as the operation temperature To increases. The second bias voltage generation circuit 220 may generate a second bias voltage VC that decreases as the operation temperature To increases. Example embodiments of the first bias voltage generation circuit 210 and the second bias voltage generation circuit 220 will be described below with reference to FIG. 11.

The first current source 310 may be connected between the input voltage node to which VIN is applied and the output node NO, and the first current source 310 may generate a first current IP based on the first bias voltage VP such that the first current IP may increase as the operation temperature To increases. The second current source 320 may be connected in parallel to the first current source 310 between the input voltage node and the output node NO, and the second current source 320 may generate a second current IC based on the second bias voltage VC such that the second current IC decreases as the operation temperature To increases.

In some example embodiments, as will be described below FIG. 11, the first current source 310 and the second current source 320 may be implemented with P-channel metal oxide semiconductor (PMOS) transistors.

Referring to FIGS. 2 and 3, the first current IP may have the PTAT characteristics and the first current IP may increase as the operation temperature To increases. In contrast, the second current IC may have the CTAT characteristics and the second current IC may decrease as the operation temperature To increases.

The first current IP and the second current IC may be summed at the output node NO and the reference current IREF may have the magnitude corresponding to a sum of the first current IP and the second current IC according to the Kirchhoff's Current Law (KCL).

As such, the reference current IREF having the constant magnitude regardless of the operation temperature To may be generated by summing the first current IP having the PTAT characteristics and the second current IC having the CTAT characteristics.

Figure 4:
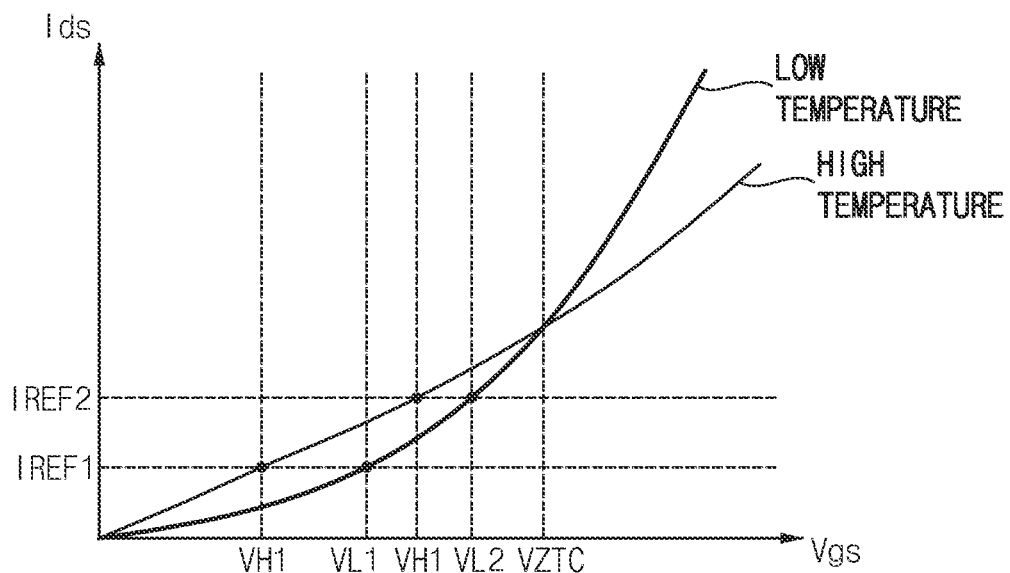
FIG. 4 is a diagram illustrating a voltage-current characteristic of a metal-oxide semiconductor field-effect-transistor (MOSFET) of a slope trimming circuit included in a voltage generation circuit according to example embodiments.

FIG. 4 is a diagram illustrating a voltage-current characteristic of a metal-oxide semiconductor field-effect-transistor (MOSFET) of a slope trimming circuit included in a voltage generation circuit according to example embodiments.

In FIG. 4, the horizontal axis represents the gate-source voltage Vgs of a MOSFET and the vertical axis represents the drain-source current Ids of the MOSFET. As shown in FIG. 4, the curvature of the characteristic curve relatively increases at a high temperature, and the curvature of the characteristic curve decreases relatively at a low temperature to become closer to a straight line. A gate-source voltage Vgs corresponding to an intersection point between the low temperature and the high temperature may be referred to as a zero temperature coefficient voltage VZTC.

As shown in FIG. 4, in a range where the gate-source voltage Vgs is lower than the zero temperature coefficient voltage VZTC, the gate-source voltage Vgs at a relatively high temperature for the same drain-source current Ids is lower than the gate-source voltage Vgs at a relatively low temperature.

In the case of a diode-coupled transistor in which a gate electrode and a drain electrode are electrically connected to each other, the gate-source voltage Vgs is equal to the drain-source voltage Vds. When the diode-coupled transistor is turned on, the drain-source voltage Vds corresponds to the threshold voltage VTH. For example, for a relatively small reference current IREF1, VL1 corresponding to the gate-source voltage Vgs at a low temperature is greater than VH1 corresponding to the gate-source voltage Vgs at a high temperature. Similarly for a relatively great reference current IREF1, VL2 corresponding to the gate-source voltage Vgs at the low temperature is greater than VH2 corresponding to the gate-source voltage Vgs at the high temperature. The gate-source voltage Vgs may be determined by the reference current IREF corresponding to the drain-source current Ids.

As a result, as the operation temperature To increases, the threshold voltage VTH of the diode-coupled transistor decreases. In other words, the threshold voltage VTH corresponding to the drain-source voltage Vds of the diode-coupled transistor may have a CTAT characteristic.

Figure 5:
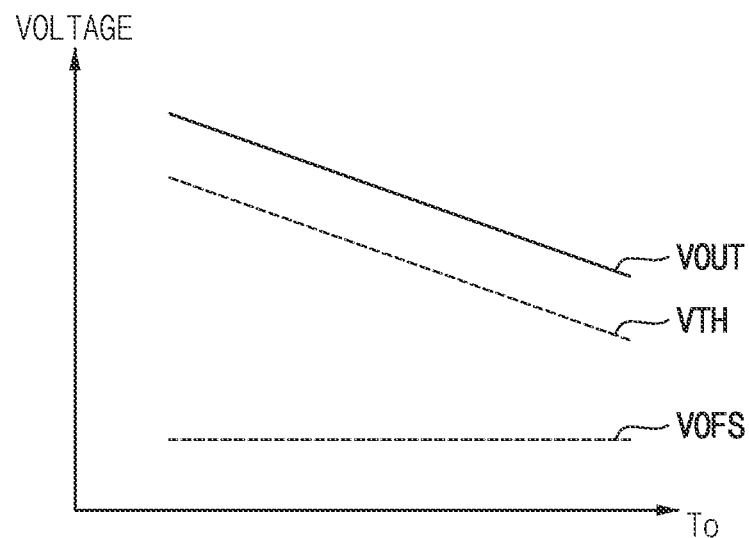
FIG. 5 is a diagram illustrating voltages generated by a voltage generation circuit according to example embodiments.

FIG. 5 is a diagram illustrating voltages generated by a voltage generation circuit according to example embodiments.

Referring to FIGS. 1 and 5, the CTAT output voltage VOUT of the voltage generator circuit 100 may be expressed as Expression 1.

$$VOUT = IREF \cdot Roff + VGS \quad \text{Expression 1}$$

$$VOFS = IREF \cdot Roff$$

In Expression 1, VOUT represents the magnitude of the CTAT output voltage, IREF represents the magnitude of the reference current, Roff represents the resistance value of the offset trimming circuit 30, VOFS represents the offset voltage, that is, the voltage of the intermediate node NC, and VGS represents the voltage between the output node NO and the intermediate node NC, that is, the threshold voltage of the diode-coupled transistor TD.

As described with reference to FIG. 4, the threshold voltage VTH has a negative slope according to the operation temperature To, that is, a negative temperature coefficient (NTC). Since the reference current IREF has a constant level regardless of the operation temperature To, the offset voltage VOFS has a constant level regardless of the operation temperature To, as shown in FIG. 5. In other words, the offset voltage VOFS has a slope of 0, that is, a zero temperature coefficient (ZTC). Compared to a typical temperature coefficient of 100 to 200 ppm/° C. for silicon resistors, the temperature coefficient for a transistor's threshold voltage is about 2 mV/° C., which may be ignored. As a result, as shown in Expression 1, the negative slope of the CTAT output voltage VOUT is equal to the negative slope of the threshold voltage VTH. As such, the slope of the diode-coupled transistor TD may be used as the slope of the CTAT output voltage VOUT. By removing the influence of the input voltage VIN on the slope of the CTAT output voltage VOUT, the desired characteristic of the CTAT output voltage VOUT may be easily implemented even in a low-voltage semiconductor device operating based on the low input voltage VIN.

Figure 6:
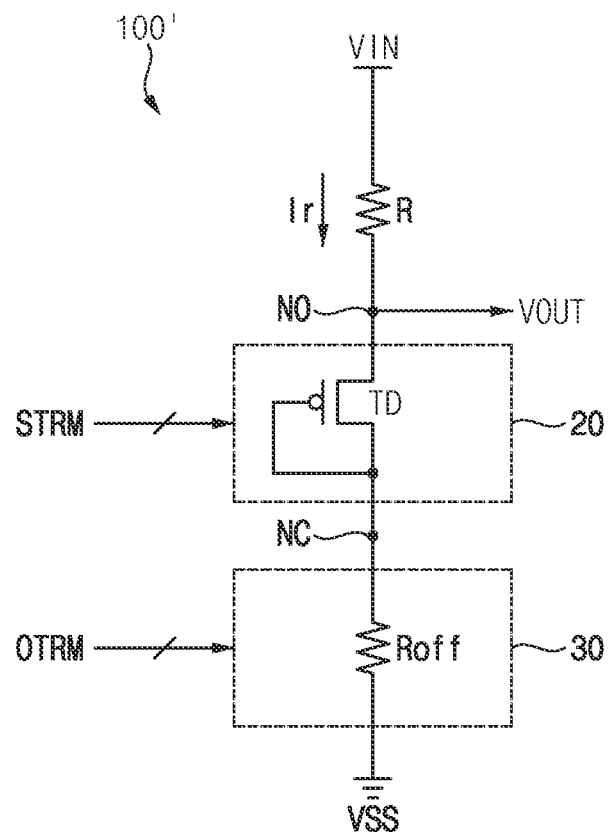
FIG. 6 is a diagram illustrating a voltage generation circuit using a reference current depending on an operation temperature.
Figure 7:
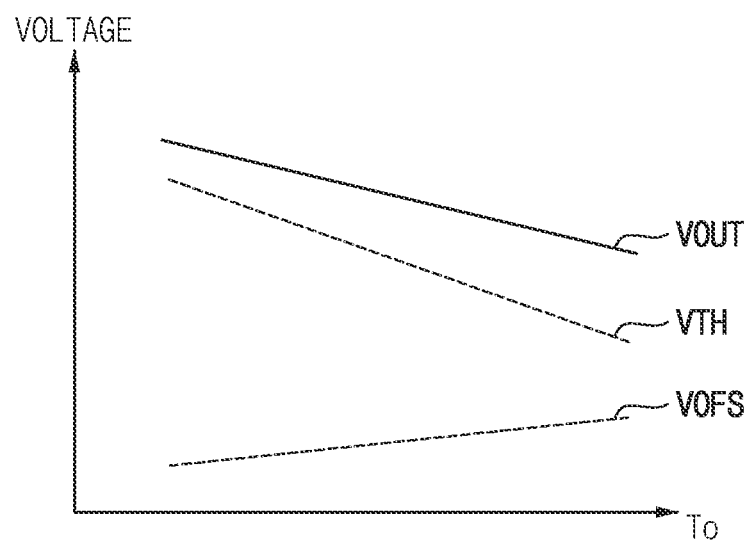
FIG. 7 is a diagram illustrating voltages generated by the voltage generation circuit of FIG. 6.

FIG. 6 is a diagram illustrating a voltage generation circuit using a reference current depending on an operation temperature, and FIG. 7 is a diagram illustrating voltages generated by the voltage generation circuit of FIG. 6.

A voltage generation circuit 100' of FIG. 6 has a configuration in which the current generation circuit 10 in the voltage generation circuit 100 of FIG. 1 is replaced with a resistor R. Since the slope trimming circuit 20 and the offset trimming circuit 30 are the same as those of FIG. 1, repeated descriptions are omitted for conciseness.

Referring to FIGS. 6 and 7, the CTAT output voltage VOUT of the voltage generation circuit 100' may be expressed as Equation 2.

$$VOUT = Ir \cdot Roff + VTH$$

$$VOFS = Ir \cdot Roff$$

$$Ir = (VIN - VOUT)/R$$

Expression 2

In Expression 2, VOUT represents the magnitude of the CTAT output voltage, Ir represents the magnitude of the current flowing through the resistor R, Roff represents the resistance value of the offset trimming circuit 30, VOFS represents the offset voltage, that is, the voltage of the intermediate node NC, and VTH represents the voltage between the output node NO and the intermediate node NC, that is, the threshold voltage of the diode-coupled transistor TD.

As may be seen from Expression 2, the current Ir that determines the offset voltage VOFS changes according to the difference between the input voltage VIN and the CTAT output voltage VOUT. Since the CTAT output voltage VOUT has a negative slope, the current Ir has a positive slope as shown in FIG. 7. Therefore, the slope of the CTAT output voltage VOUT becomes different from the slope of the threshold voltage VTH, and the minimum level of the input voltage VIN is limited to ensure the NTC of the CTAT output voltage VOUT. In other words, due to the influence of the input voltage VIN on the slope of the CTAT output voltage VOUT, the voltage generator circuit 100' of FIG. 6 operates based on the low input voltage VIN. It is not easy to implement the characteristic CTAT output voltage VOUT.

On the other hand, the voltage generator circuit 100 of FIG. 1 according to example embodiments generates the CTAT output voltage VOUT using the reference current IREF having a constant magnitude regardless of the operation temperature To. Therefore, even when the input voltage VIN is small, the desired CTAT output voltage VOUT may be easily implemented.

Figure 8:
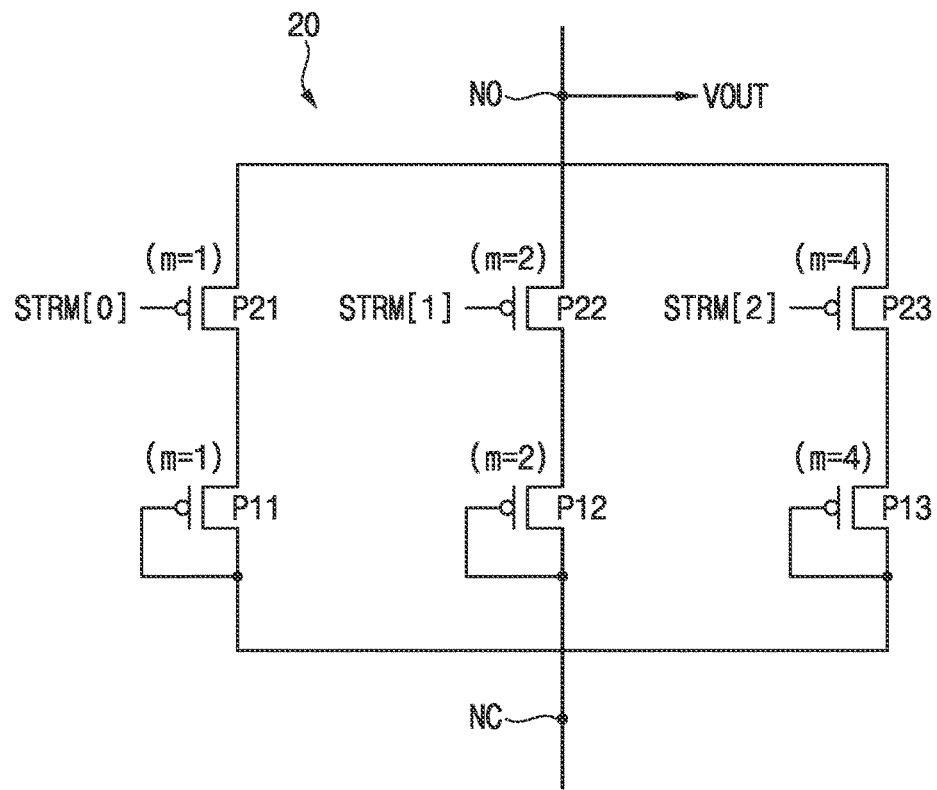
FIG. 8 is a circuit diagram illustrating an example of a slope trimming circuit included in a voltage generation circuit according to example embodiments.

FIG. 8 is a circuit diagram illustrating an example of a slope trimming circuit included in a voltage generation circuit according to example embodiments.

Referring to FIG. 8, the slope trimming circuit 20 may include a plurality of diode-coupled transistors, for example, a first diode-coupled transistor P11, a second diode-coupled transistor P12 and a third diode-coupled transistor P13 and a plurality of switches, for example, a first switch P21, a second switch P22 and a third switch P23. Although FIG. 8 shows a configuration including three diode-coupled transistors for convenience of illustration and description, example embodiments are not limited to a specific number of diode-coupled transistors.

The first, second and third diode-coupled transistors P11, P12 and P13 may be connected in parallel between the output node NO and the intermediate node NC. The first, second and third switches P21, P22 and P23 may be connected between the output node NO and respective ones of the first, second and third diode-coupled transistors P11, P12 and P13. In other words, the first switch P21 may be connected between the output node NO and the first diode-coupled transistor P11, the second switch P22 may be connected between the output node NO and the second diode-coupled transistor P12, and the third switch P23 may be connected between the output node NO and the third diode-coupled transistor P13. The first, second and third switches P21, P22 and P23 may be turned on based on respective ones of first, second and third bit signals STRM[0], STRM[1] and STRM[2] of the first trimming code STRM. That is, the first switch P21 may be turned on based on the first bit STRM[0] of the first trimming code STRM, the second switch P22 may be turned on based on the second bit STRM[1] of the first trimming code STRM, and the third switch P23 may be turned on based on the third bit STRM[2] of the first trimming code STRM.

In an example embodiment, as shown in FIG. 8, the first, second and third diode-coupled transistors P11, P12 and P13 and the first, second and third switches P21, P22 and P23 may be implemented with PMOS transistors. In this case, the first switch P21 may be turned on to electrically connect the first diode-connected transistor P11 to the output node NO when the first bit signal STRM[0] is a logic low level (i.e., a logic value of 0). The second switch P22 may be turned on to electrically connect the second diode-connected transistor P12 to the output node NO when the second bit signal STRM[1] is at a logic low level. The third switch P23 may be turned on to electrically connect the third diode-connected transistor P13 to the output node NO when the third bit signal STRM[2] is at a logic low level.

In an example embodiment, as shown in FIG. 8, at least some of the PMOS transistors included in the slope trimming circuit 20 may have different sizes. For example, the ratio of the sizes m of the first, second and third diode-coupled transistors P11, P12 and P13 and the ratio m of the first, second and third switches P21, P22 and P23 may be 1:2:4.

By changing the value of the first trimming code STRM, a combination of diode-coupled transistors electrically connected between the output node NO and the intermediate node NC may be changed, and as a result, the slope of the threshold voltage VTH corresponding to the diode-coupled transistors TD may be adjusted.

Figure 9:
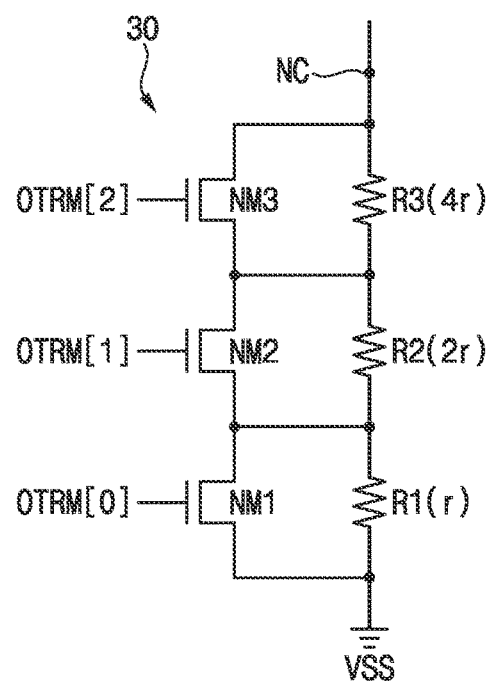
FIG. 9 is a circuit diagram illustrating an example of an offset trimming circuit included in a voltage generation circuit according to example embodiments.

FIG. 9 is a circuit diagram illustrating an example of an offset trimming circuit included in a voltage generation circuit according to example embodiments.

Referring to FIG. 9, the offset trimming circuit 30 may include a plurality of resistors, for example, a first resistor R1, a second resistor R2 and a third resistor R3, and a plurality of switches, for example, a first switch NM1, a second switch NM2 and a third switch NM3. Although FIG. 9 shows a configuration including three resistors for convenience of illustration and description, example embodiments are not limited to a specific number of resistors.

The first, second and third resistors R1, R2 and R3 are connected in series between the intermediate node NC and the ground voltage VSS. The first, second and third switches NM1, NM2 and NM3 are connected in parallel with respective ones of the first, second and third resistors R1, R2 and R3. That is, the first switch NM1 is connected in parallel with the first resistor R1, the second switch NM2 is connected in parallel with the second resistor R2, and the third transistor NM3 is connected in parallel with the third resistor R2. The first, second and third switches NM1, NM2 and NM3 may be turned on based on respective ones of first, second and third bit signals OTRM[0], OTRM[1] and OTRM[2] of the second trimming code OTRM. That is, the first switch NM1 may be turned on based on the first bit OTRM[0] of the second trimming code, the second switch NM2 may be turned on based on the second bit OTRM[1] of the second trimming code, and the third switch NM3 may be turned on based on the third bit OTRM[2] of the second trimming code.

In an example embodiment, as shown in FIG. 9, the first, second and third switches NM1, NM2 and NM3 may be implemented with NMOS transistors. In this case, the first switch NM1 may be turned on to exclude the first resistor R1 when the first bit signal OTRM[0] is a logic high level (i.e., a logic value of 1). The second switch NM2 may be turned on to exclude the second resistor R2 when the second bit signal OTRM[1] is at a logic high level. The third switch NM3 may be turned on to exclude the third resistor R3 when the third bit signal OTRM[2] is at a logic high level.

In an example embodiment, as shown in FIG. 9, at least some of the first, second and third resistors R1, R2 and R3 may have different resistance values. For example, resistance values of the first, second and third resistors R1, R2 and R3 may be r, 2r and 4r, respectively.

By changing the value of the second trimming code OTRM, the combined resistance between the output node NO and the intermediate node NC may be changed, and as a result, the offset voltage VOFS corresponding to the resistor Roff of FIG. 1 may be adjusted.

Figure 10:
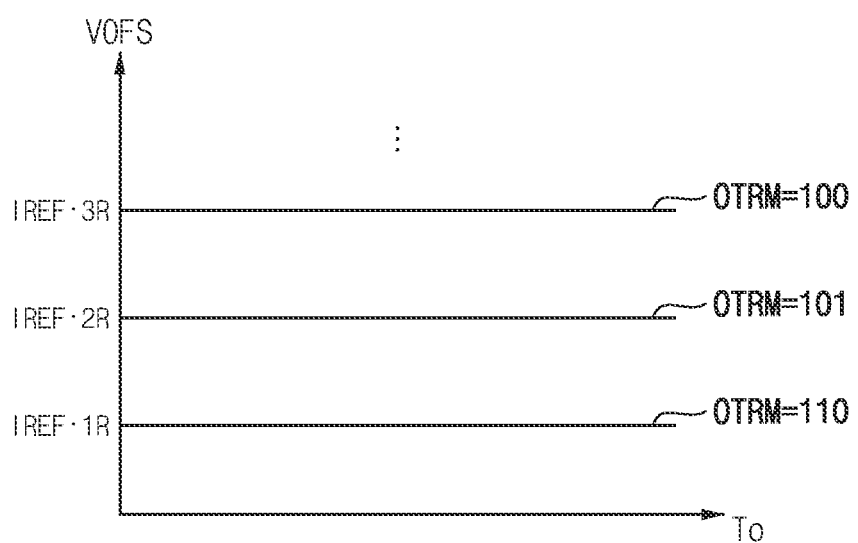
FIG. 10 is a diagram illustrating trimming of an offset voltage based on a trimming code by the offset trimming circuit of FIG. 9, according to example embodiments.

FIG. 10 is a diagram illustrating trimming of an offset voltage based on a trimming code by the offset trimming circuit of FIG. 9, according to example embodiments.

FIG. 10 illustrates the offset voltage VOFS according to the value of the second trimming code OTRM. For example, when the value of the second trimming code OTRM is '110', the offset voltage VOFS may be IREF·1r. When the value of the second trimming code OTRM is '101', the offset voltage VOFS may be IREF·2r. When the value of the second trimming code OTRM is '100', the offset voltage VOFS may be IREF·3r. As shown in FIG. 10, the offset voltage VOFS for each value of the second trimming code OTRM may have a constant level regardless of the operation temperature To.

Figure 11:
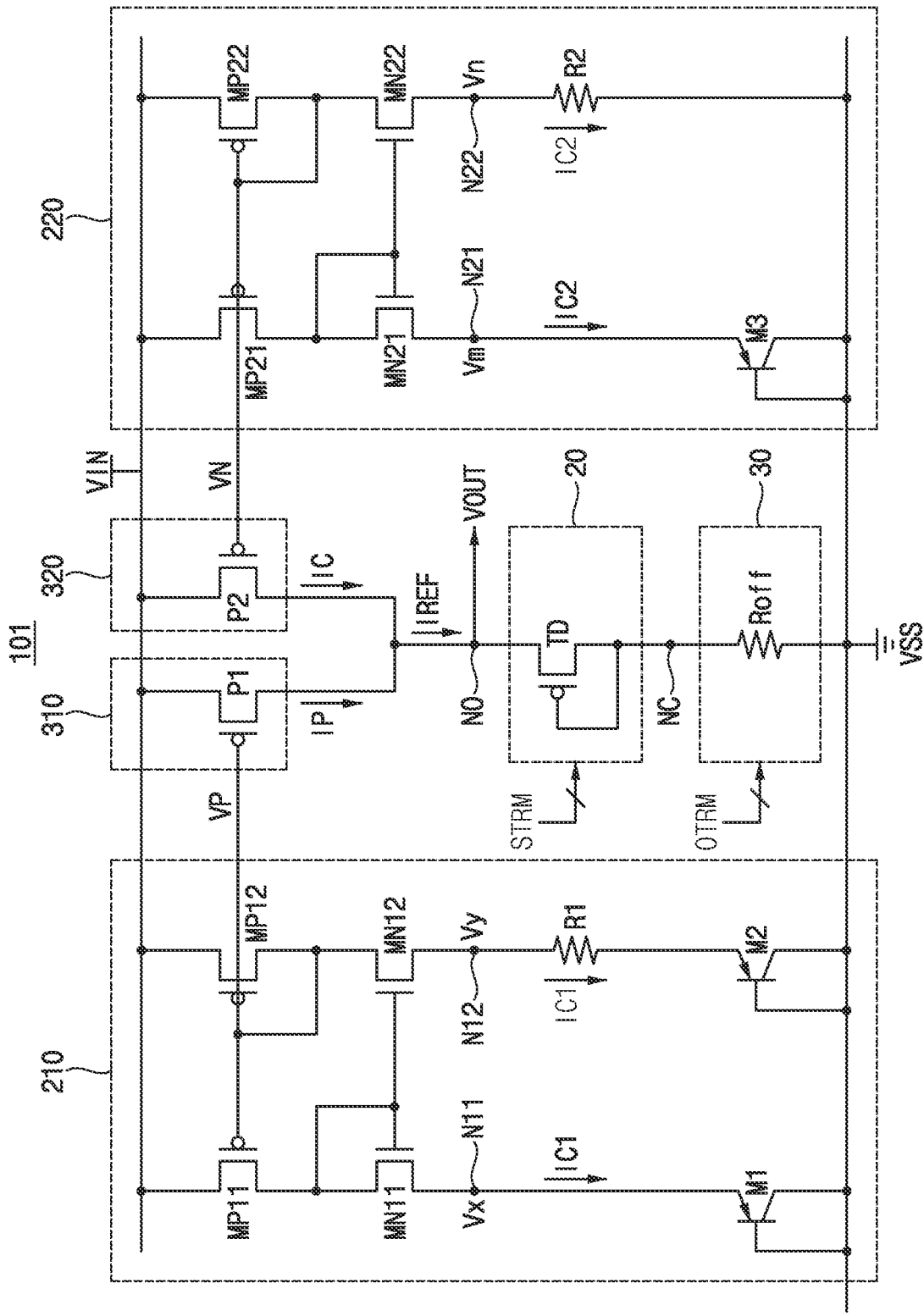
FIG. 11 is a circuit diagram illustrating a voltage generation circuit according to example embodiments.

FIG. 11 is a circuit diagram illustrating a voltage generation circuit according to example embodiments.

Referring to FIG. 11, a voltage generation circuit 101 may include a current generation circuit, a slope trimming circuit 20 and an offset trimming circuit 30. As described with reference to FIG. 2, the current generation circuit may include a first bias voltage generation circuit 210, a second bias voltage generation circuit 220, a first current source 310 and a second current source 320. Since the slope trimming circuit 20 and the offset trimming circuit 30 are the same as the slope trimming circuit 20 and the offset trimming circuit 30 of FIG. 1, repeated descriptions are omitted for conciseness.

The first current source 310 may include a first PMOS transistor P1 including a gate electrode that receives a first bias voltage VP, a source electrode connected to the input voltage node to which VIN is applied and a drain electrode connected to the output node NO. The second current source 320 may include a second PMOS transistor P2 including a gate electrode that receives the second bias voltage VC, a source electrode connected to the input voltage node and a drain electrode connected to the output node NO. The first current source 310 and the second current source 320 may generate the reference current IREF having a constant magnitude regardless of the operation temperature To by summing the first current IP having the PTAT characteristic and the second current IC having the CTAT characteristic.

The first bias voltage generation circuit 210 includes PMOS transistors MP11 and MP12, NMOS transistors MN11 and MN12, a resistor R1, a first bipolar junction transistor (BJT) M1 and a second BJT M2. The PMOS transistors MP11 and MP12 have the same sizes and constitute a first current mirror. The NMOS transistors MN11 and MN12 have the same sizes and constitute a second current mirror. The first BJT M1 and the second BJT M2 have a size ratio of 1:n.

The first bias voltage generation circuit 210 has the relationship of Expression 3 to satisfy the condition that the voltage Vx of the node N11 is equal to the voltage Vy of the node N12.

$$V_{BE(M1)} = V_{BE(M2)} + I_{C1} * R_1 \qquad \text{Expression 3}$$

In Expression 3, $V_{BE(M1)}$ represents the base-emitter voltage of the first BJT M1, $V_{BE(M2)}$ represents the base-emitter voltage of the second BJT M2, Ic1 represents the represents the current generated by the first current mirror MP11 and MP12 and the second current mirror MN11 and MN12 and R1 represents the resistance value of the resistor R1.

It is satisfied that $\Delta V_{BE}=V_{BE(M1)}-V_{BE(M2)}=V_T \cdot \ln(n)$, therefore, the current Ic1 may be expressed as Expression 4, where k represents the Boltzmann constant, and q represents the electron charge.

$$I_{C1} = \frac{V_T \ln(n)}{R_1} = \frac{\frac{kT}{q}\ln(n)}{R_1} \qquad \text{Expression 4}$$

The current Ic1 is proportional to temperature and is linear. Accordingly, the first bias voltage VP corresponding to the gate voltage of the diode-coupled PMOS transistor MP12 may have the PTAT characteristic.

The second bias voltage generation circuit 220 may include PMOS transistors MP21 and MP22, NMOS transistors MN21 and MN22, a resistor R2 and a third BJT M3. The PMOS transistors MP21 and MP22 have the same sizes and constitute a third current mirror. The NMOS transistors MN21 and MN22 have the same sizes and constitute a fourth current mirror. The size of the third BJT M3 is the same as that of the first BJT M1.

The second bias voltage generation circuit 220 has the relationship of Expression 5 to satisfy the condition that the voltage Vm of the node N21 is equal to the voltage Vn of the node N22.

$$V_{BE(M3)} = I_{C2} * R_2 \quad \text{Expression 5}$$

In Expression 5, $V_{BE(M3)}$ represents the base-emitter voltage of the third BJT M3, Ic2 represents the current generated by the third current mirror MP21 and MP22 and the fourth current mirror MN21 and MN22, and R2 represents the resistance value of the resistor R2.

Since $V_{BE(M3)}$ has a negative slope according to temperature, current Ic2 may have the CTAT characteristic. Accordingly, the second bias voltage VC corresponding to the gate voltage of the diode-coupled PMOS transistor MP22 may have the CTAT characteristic.

The first bias voltage generator circuit 210 and the second bias voltage generator circuit 220 using BJT have been described with reference to FIG. 11, but example embodiments are not limited thereto. For example, the BJTs in FIG. 11 may be replaced with diodes.

Although the first bias voltage VP and the second bias voltage VC are voltages having the PTAT characteristic and the CTAT characteristic, respectively, the first bias voltage VP and the second bias voltage VC are nonlinear since the first bias voltage VP and the second bias voltage VC change in the form of a square root of current. On the other hand, the CTAT output voltage VOUT, which is the final output of the voltage generator circuit 101 may have enhanced linearity by canceling the nonlinearity between the first bias voltage VP and the second bias voltage VC.

Figure 12:
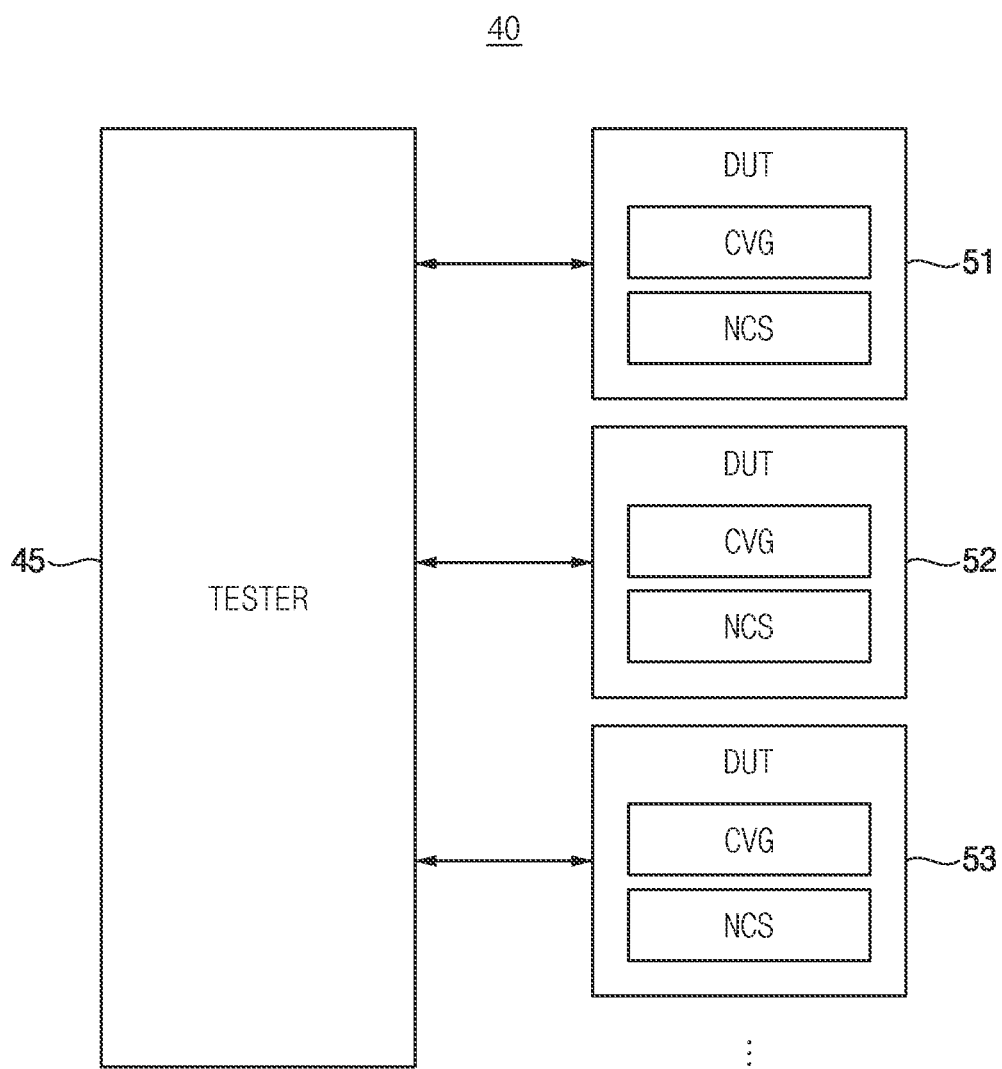
FIG. 12 is a diagram illustrating a system of testing a semiconductor device including a voltage generation circuit according to example embodiments.
Figure 13:
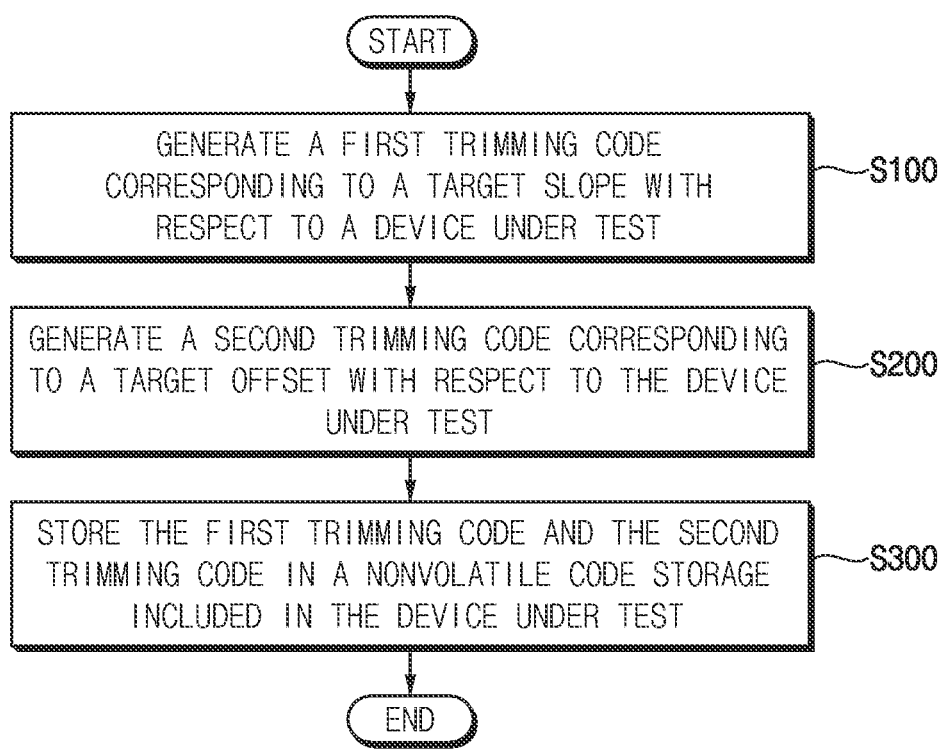
FIG. 13 is a flowchart illustrating a method of testing a voltage generation circuit according to example embodiments.

FIG. 12 is a diagram illustrating a system of testing a semiconductor device including a voltage generation circuit according to example embodiments, and FIG. 13 is a flowchart illustrating a method of testing a voltage generation circuit according to example embodiments.

Referring to FIG. 12, a test system 40 may include a tester 45 and a plurality of devices under test DUT 51, 52 and 53. Each of the devices under test 51, 52 and 53 may include a voltage generator circuit CVG and a nonvolatile code storage NCS as described above. Although FIG. 12 shows three devices 51, 52 and 53 to be tested for convenience of illustration and description, a larger number of devices to be tested may be mounted in the tester 45 such that a parallel test may be performed on the larger number of devices.

Referring to FIGS. 12 and 13, the tester 45 may generate a first trimming code STRM corresponding to a target slope with respect to each device under test DUT (S100). The tester 45 may sequentially change the value of the first trimming code STRM and search for the value of the first trimming code STRM such that the slope of the CTAT output voltage VOUT of the voltage generator circuit CVG according to the operation temperature To is closest to the target slope.

The tester 45 may generate a second trimming code OTRM corresponding to the target offset with respect to each device under test DUT (S200). The tester 45 may sequentially change the value of the second trimming code OTRM to search for the value of the second trimming code OTRM such that the offset voltage VOFS of the CTAT output voltage VOUT of the voltage generator circuit CVG is the closest to the target offset. You can search the value of OTRM.

The tester 45 may store the first trimming code STRM and the second trimming code OTRM in the nonvolatile code storage VCS included in each device under test DUT (S300). The nonvolatile code storage VCS may be a fuse circuit, EEPROM, or nonvolatile memory.

As such, the first trimming code STRM and the second trimming code OTRM stored in the nonvolatile code storage unit VCS are provided to the voltage generator circuit CVG after the device under test DUT is shipped to implement the operation characteristics of the CTAT output voltage VOUT.

The operation deviation of the devices under test DUT may be reduced by independently optimizing the first trimming code STRM and the second trimming code OTRM for each device under test DUT. By reducing the operation deviation, the performance of the devices under test DUT may be improved and operation time may be reduced.

Figure 14:
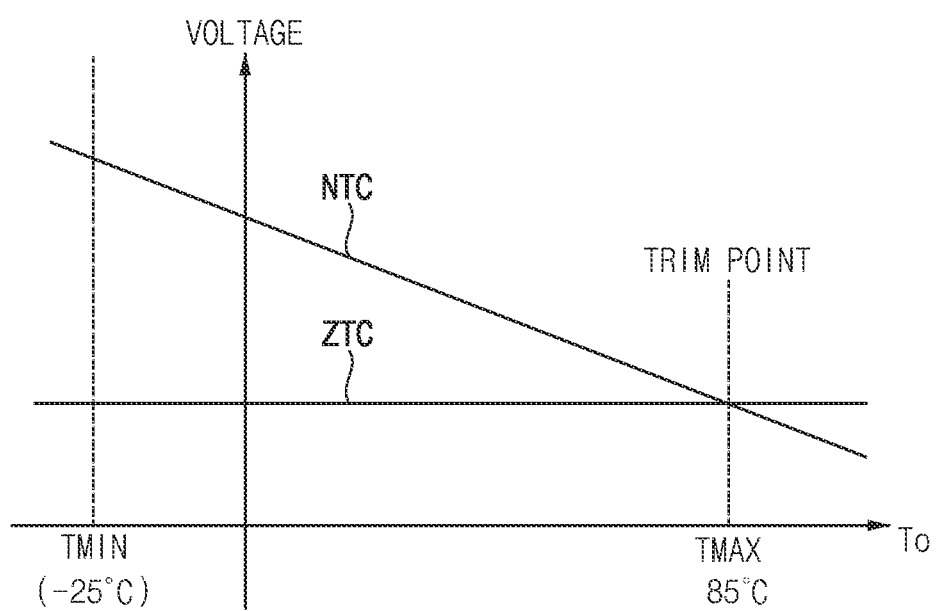
FIG. 14 is a diagram for describing a trimming operation of a voltage generation circuit according to example embodiments.

FIG. 14 is a diagram for describing a trimming operation of a voltage generation circuit according to example embodiments.

Referring to FIG. 14, a temperature range in which normal operations of the semiconductor device is guaranteed may be defined as a minimum operation temperature TMIN and a maximum operation temperature TMAX. For example, in some example embodiments, the minimum operation temperature TMIN may be about −25° C. and the maximum operation temperature TMAX may be about 85° C.

The aforementioned CTAT output voltage VOUT may be trimmed to have a negative slope and a trim point at which the zero temperature coefficient ZTC and the negative temperature coefficient NTC become equal at the maximum operation temperature TMAX.

Figure 15:
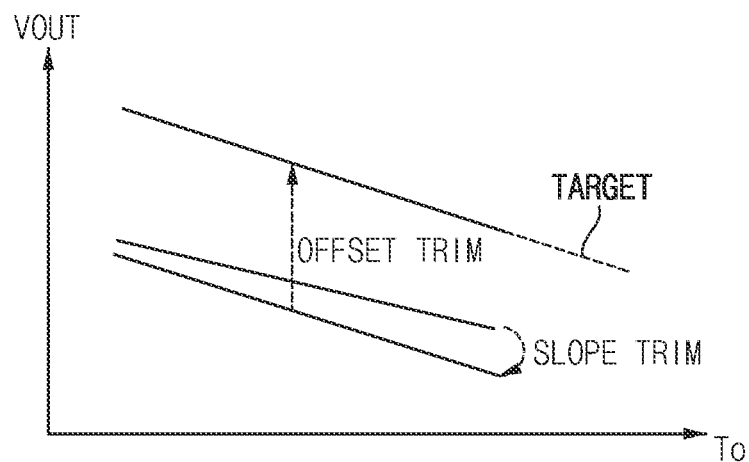
FIG. 15 is a diagram illustrating a trimming process of a voltage generation circuit according to example embodiments.
Figure 16:
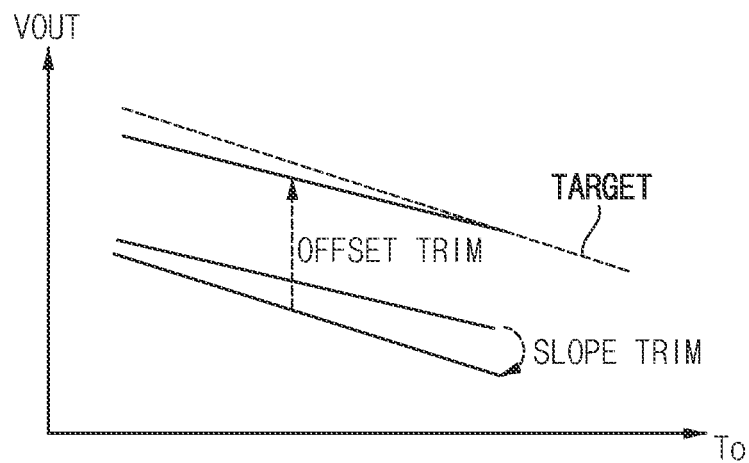
FIG. 16 is a diagram illustrating a trimming process of the voltage generation circuit of FIG. 6, according to example embodiments.

FIG. 15 is a diagram illustrating a trimming process of a voltage generation circuit according to example embodiments, and FIG. 16 is a diagram illustrating a trimming process of the voltage generation circuit of FIG. 6 by way of comparison.

Referring to FIGS. 15 and 16, the slope of the CTAT output voltage VOUT may be trimmed first, and then the offset voltage VOFS may be trimmed.

According to example embodiments, the voltage generation circuit 100 of FIG. 1 that uses the reference current IREF having a constant magnitude independent of temperature change may trim the CTAT output voltage VOUT to be very close to the target while reducing the test time, since the negative slope of the CTAT output voltage VOUT is equal to the negative slope of the threshold voltage VTH, as described with reference to FIG. 5.

On the other hand, in the voltage generation circuit 100' of FIG. 6 using the current Ir that varies with temperature, it is not easy to trim the CTAT output voltage VOUT to be close to the target, since the slope of the CTAT output voltage VOUT is different from the slope of the threshold voltage VTH as described with reference to FIG. 7.

When there is a large operational variation between respective semiconductor devices, operation margins such as timing margins and voltage margins of the semiconductor devices must be set high to prevent malfunction. This high setting causes performance degradation of the semiconductor devices. According to example embodiments, the CTAT output voltage VOUT is generated using the reference current IREF having a constant magnitude regardless of the operation temperature To, and the CTAT output voltage VOUT is trimmed to approach the target, the operation deviation of semiconductor devices may be reduced and performance may be improved.

Hereinafter, example embodiments of a semiconductor memory device using a voltage generation circuit will be described. Example embodiments are not limited to semiconductor memory devices, and the voltage generation circuit may be applied to any semiconductor device requiring a voltage having the CTAT characteristic.

Figure 17:
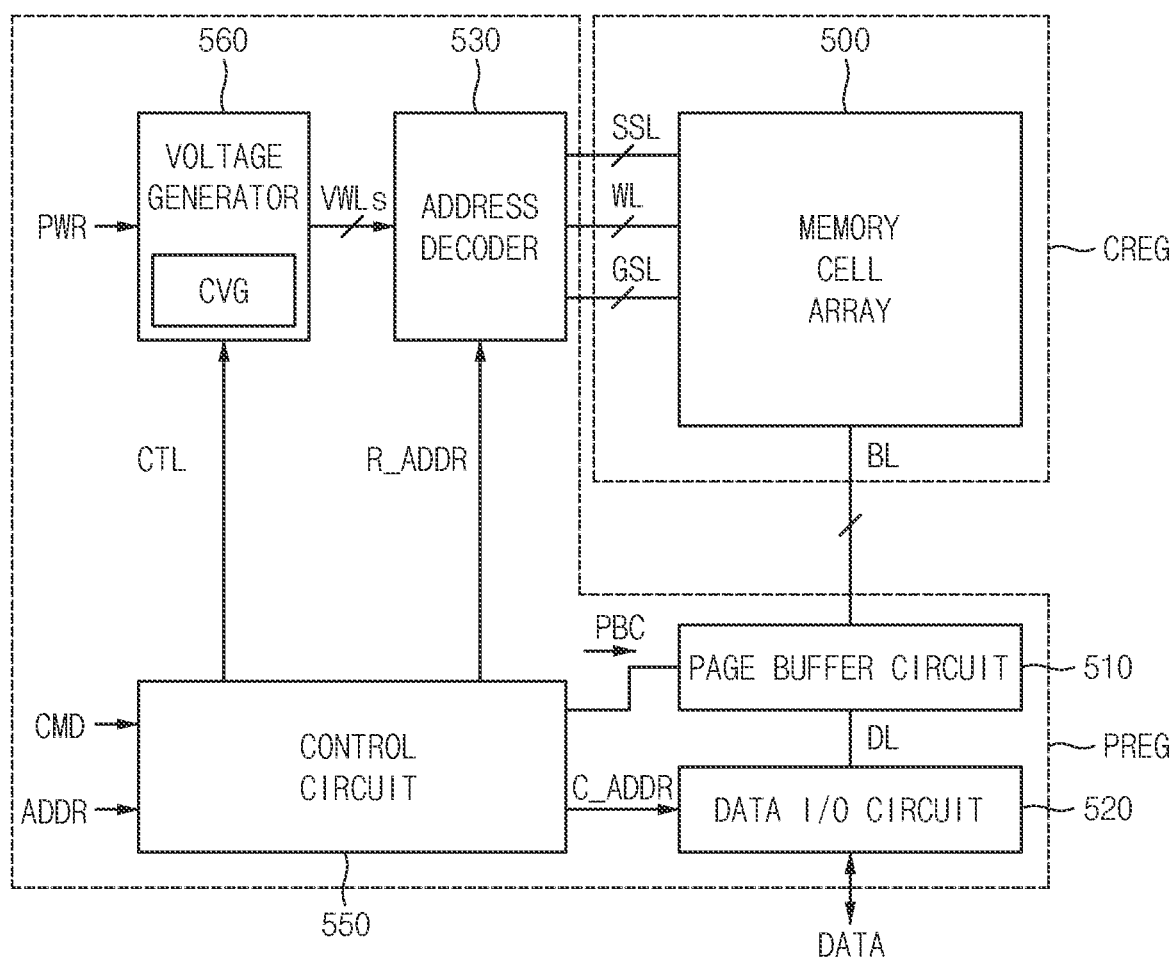
FIG. 17 is a block diagram illustrating a nonvolatile memory device according to example embodiments.

FIG. 17 is a block diagram illustrating a nonvolatile memory device according to example embodiments.

Referring to FIG. 7, a nonvolatile memory device 1000 may include a memory cell array 500, a page buffer circuit 510, a data input/output (I/O) circuit 520, an address decoder 530, a control circuit 550 and a voltage generator 560. The memory cell array 500 may be formed in a cell region CREG, and the page buffer circuit 510, the data I/O circuit 520, the address decoder 530, the control circuit 550 and the voltage generator 560 may be formed in a peripheral region PREG, for example.

The memory cell array 500 may be coupled to the address decoder 530 through a plurality of string selection lines SSL, a plurality of wordlines WL, and a plurality of ground selection lines GSL. The memory cell array 500 may be coupled to the page buffer circuit 510 through a plurality of bitlines BL. The memory cell array 500 may include a plurality of memory cells coupled to the plurality of wordlines WL and the plurality of bitlines BL.

In some example embodiments, the memory cell array 500 may be a three-dimensional memory cell array, which is formed on a substrate in a three-dimensional structure (or a vertical structure). In this case, the memory cell array 500 may include cell strings (e.g., NAND strings) that are vertically oriented such that at least one memory cell is located over another memory cell.

The control circuit 550 may receive a command (signal) CMD and an address (signal) ADDR from a memory controller and control erase, program and read operations of the nonvolatile memory device 1000 in response to (or based on) at least one of the command signal CMD and the address signal ADDR. An erase operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 550 may generate the control signals CTL used to control the operation of the voltage generator 560, and may generate the page buffer control signal PBC for controlling the page buffer circuit 510, based on the command signal CMD, and generate the row address R_ADDR and the column address C_ADDR based on the address signal ADDR. The control circuit 550 may provide the row address R_ADDR to the address decoder 530 and provide the column address C_ADDR to the data I/O circuit 520.

The address decoder 530 may be coupled to the memory cell array 500 through the string selection lines SSL, the wordlines WL, and the ground selection lines GSL. During the program operation or the read operation, the address decoder 530 may determine (or select) one of the wordlines WL as a selected wordline and determine the remaining wordlines WL except for the selected wordline as unselected wordlines based on the row address R_ADDR.

During the program operation or the read operation, the address decoder 530 may determine one of the string selection lines SSL as a selected string selection line and determine rest of the string selection lines SSL except for the selected string selection line as unselected string selection lines based on the row address R_ADDR.

The voltage generator 560 may generate wordline voltages VWL, which are required for the operation of the memory cell array 500 of the nonvolatile memory device 1000, based on the control signals CTL. The voltage generator 560 may receive the power PWR from the memory controller. The wordline voltages VWL may be applied to the wordlines WL through the address decoder 530.

The voltage generator 560 may generate wordline voltages VWL that decrease as the operation temperature increases using the voltage generation circuit CVG. In other words, the voltage generator 560 may apply the wordline voltage generated using a bandgap reference circuit, etc., to the voltage generation circuit CGV as the above-described input voltage VIN independent of the operation temperature To, and generate (i.e., output) the above-described CTAT output voltage VOUT. As such, the CTAT output voltage VOUT having the CTA characteristics may be applied to the wordline.

For example, during the erase operation, the voltage generator 560 may apply an erase voltage to a well and/or a common source line of a memory block and apply an erase permission voltage (e.g., a ground voltage) to all of the wordlines of the memory block or a portion of the wordlines based on an erase address. During the erase verification operation, the voltage generator 560 may apply an erase verification voltage simultaneously to all of the wordlines of the memory block or sequentially (e.g., one-by-one) to the wordlines.

For example, during the program operation, the voltage generator 560 may apply a program voltage to the selected wordline and may apply a program pass voltage to the unselected wordlines. During the program verification operation, the voltage generator 560 may apply a program verification voltage to the first wordline and may apply a verification pass voltage to the unselected wordlines.

During the normal read operation, the voltage generator 560 may apply a read voltage to the selected wordline and may apply a read pass voltage to the unselected wordlines. During the data recover read operation, the voltage generator 560 may apply the read voltage to a wordline adjacent to the selected wordline and may apply a recover read voltage to the selected wordline.

The page buffer circuit 510 may be coupled to the memory cell array 500 through the bitlines BL. The page buffer circuit 510 may include multiple buffers. In some embodiments, each buffer may be connected to only a single bitline. In some embodiments, each buffer may be connected to two or more bitlines. The page buffer circuit 510 may temporarily store data to be programmed in a selected page or data read out from the selected page of the memory cell array 500.

The data I/O circuit 520 may be coupled to the page buffer circuit 510 through data lines DL. During the program operation, the data I/O circuit 520 may receive program data DATA received from the memory controller and provide the program data DATA to the page buffer circuit 510 based on the column address C_ADDR received from the control circuit 550. During the read operation, the data I/O circuit 520 may provide read data DATA, having been read from the memory cell array 500 and stored in the page buffer circuit 510, to the memory controller based on the column address C_ADDR received from the control circuit 550.

The page buffer circuit 510 and the data I/O circuit 520 may read data from a first area of the memory cell array 500 and write this read data to a second area of the memory cell array 500 (e.g., without transmitting the data to a source external to the nonvolatile memory device 1000, such as to the memory controller). For example, the page buffer circuit 510 and the data I/O circuit 520 may perform a copy-back operation.

Figure 18:
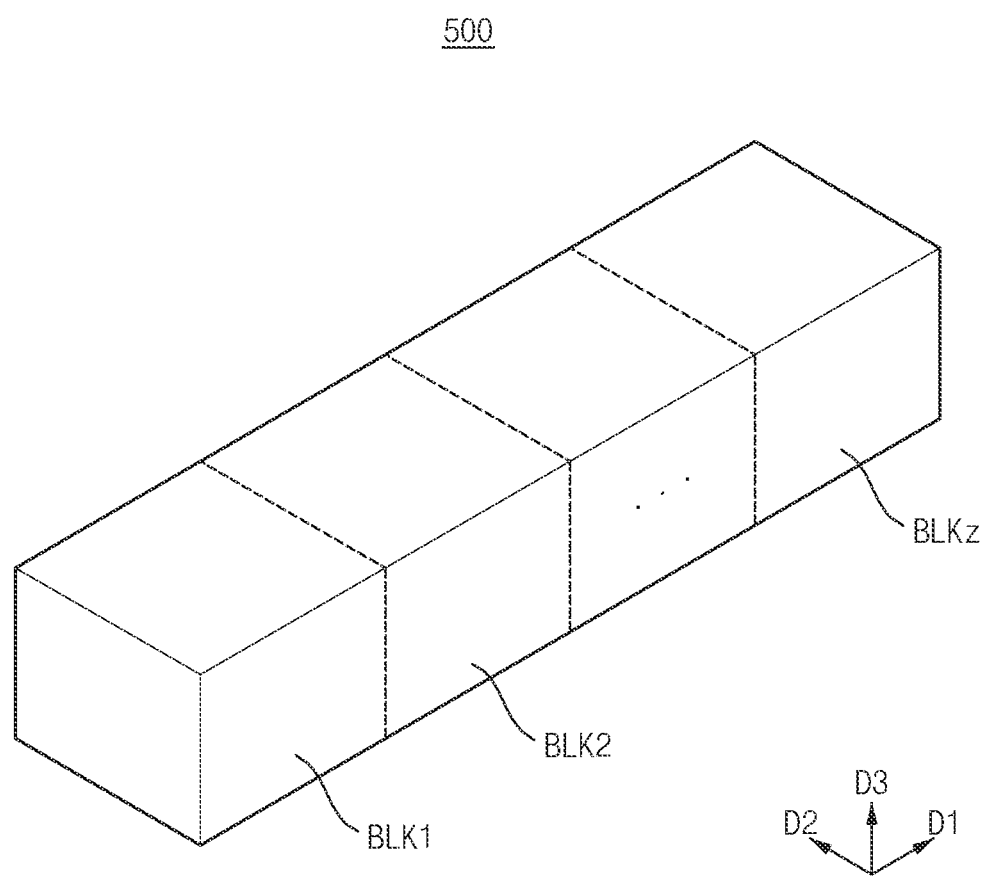
FIG. 18 is a block diagram illustrating a memory cell array included in the nonvolatile memory device of FIG. 17, according to example embodiments.
Figure 19:
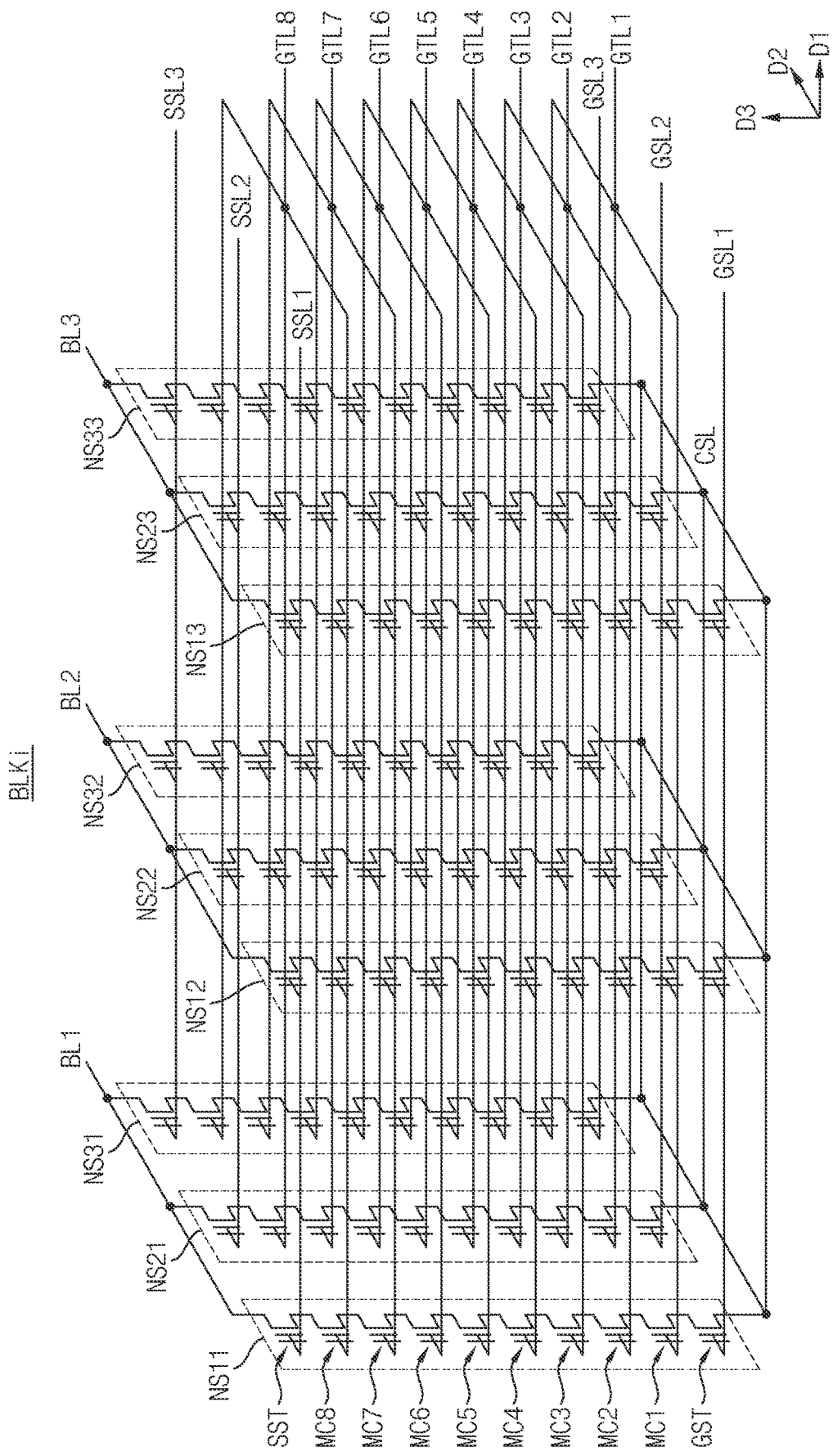
FIG. 19 is a circuit diagram illustrating an equivalent circuit of a memory block included in the memory cell array of FIG. 18, according to example embodiments.

FIG. 18 is a block diagram illustrating a memory cell array included in the nonvolatile memory device of FIG. 17, and FIG. 19 is a circuit diagram illustrating an equivalent circuit of a memory block included in the memory cell array of FIG. 18.

Referring to FIG. 18, the memory cell array 500 may include memory blocks BLK1 to BLKz. In some embodiments, the memory blocks BLK1 to BLKz may be selected by the address decoder 430 of FIG. 17. For example, the address decoder 430 may select a particular memory block BLK corresponding to a block address among the memory blocks BLK1 to BLKz.

The memory block BLKi of FIG. 18 may be formed on a substrate in a three-dimensional structure (or a vertical structure). For example, NAND strings or cell strings included in the memory block BLKi may be formed in the first horizontal direction D1 perpendicular to the upper surface of the substrate.

Referring to FIG. 19, the memory block BLKi may include NAND strings NS11 to NS33 coupled between bitlines BL1, BL2 and BL3 and a common source line CSL. Each of the NAND strings NS11 to NS33 may include a string selection transistor SST, a memory cells MC1 to MC8, and a ground selection transistor GST. In FIG. 19, each of the NAND strings NS11 to NS33 is illustrated to include eight memory cells MC1 to MC8. However, embodiments are not limited thereto. In some embodiments, each of the NAND strings NS11 to NS33 may include any number of memory cells.

Each string selection transistor SST may be connected to a corresponding string selection line (one of SSL1 to SSL3). The memory cells MC1 to MC8 may be connected to corresponding gate lines GTL1 to GTL8, respectively. The gate lines GTL1 to GTL8 may be wordlines and some of the gate lines GTL1 to GTL8 may be dummy wordlines. Each ground selection transistor GST may be connected to a corresponding ground selection line (one of GSL1 to GSL3). Each string selection transistor SST may be connected to a corresponding bitline (e.g., one of BL1, BL2 and BL3), and each ground selection transistor GST may be connected to the common source line CSL.

Wordlines (e.g., WL1) having the same height may be commonly connected, and the ground selection lines GSL1 to GSL3 and the string selection lines SSL1 to SSL3 may be separated. The gate lines corresponding to the intermediate switching lines may be separated as will be described below. In FIG. 19, the memory block BLKi is illustrated to be coupled to eight gate lines GTL1 to GTL8 and three bitlines BL1 to BL3. However, embodiments are not limited thereto. Each memory block in the memory cell array 500 may be coupled to any number of wordlines and any number of bitlines.

Figure 20:
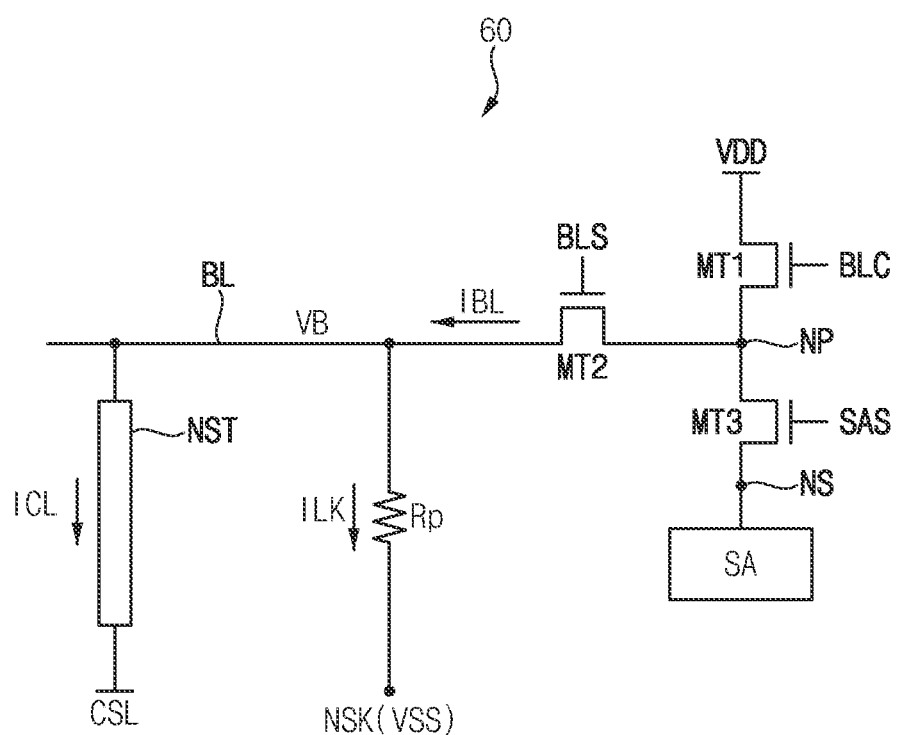
FIG. 20 is a diagram illustrating a portion of a nonvolatile memory device according to example embodiments.

FIG. 20 is a diagram illustrating a portion of a nonvolatile memory device according to example embodiments.

Referring to FIG. 20, a nonvolatile memory device 60 may include a bitline BL, a precharge transistor MT1, a bitline selection transistor MT2, a sensing transistor MT3, a cell string NST and a sense amplifier SA. For convenience of illustration and description, FIG. 20 illustrates one cell string NST connected to the bitline BL, and a plurality of cell strings may be connected to the bitline BL as described with reference to FIG. 19.

The precharge transistor MT1 may be connected between a power supply voltage VDD and a precharge node NP, and may be turned on based on a precharge signal BLC applied to a gate electrode of the precharge transistor MT1 to electrically connect the power supply voltage VDD and the precharge node NP. The precharge transistor MT1 may be turned on during a precharge period of a read operation to generate a bitline current IBL flowing from the power supply voltage VDD to the bitline BL.

The bitline selection transistor MT2 may be connected between the precharge node NP and the bitline BL, and may be turned on based on a bitline selection signal BLS applied to a gate electrode of the bitline selection transistor MT2 to electrically connect the precharge node NP and the bitline BL. The bitline selection transistor MT2 may be turned on during the precharge period to electrically connect the precharge node NP and the bitline BL.

The develop transistor MT3 may be connected between the precharge node NP and a sensing node NS, and may be turned on based on a develop signal SAS applied to a gate electrode of the develop transistor MT3 to electrically connect the precharge node NP and the sensing node NS. The develop transistor MT3 may be turned on during a develop period after the precharge period to electrically connect the precharge node NP and the sensing node NS. The bitline selection transistor MT2 may be turned on during the develop period and thus the bitline BL may be electrically connected to the sensing node NS during the develop period.

The cell string NST may include a plurality of memory cells connected between the bitline BL and the source line CSL as described with reference to FIG. 19. The cell string NST may generate a cell current ICL based on the bitline current IBL during the precharge period.

During the read operation, a selected memory cell may be selected among the plurality of memory cells in the cell string NST based on a read address. A read voltage may be applied to the selected memory cell and a pass voltage may be applied to the other memory cells. The selected memory cell may be turned off when a threshold voltage of the selected memory cell is higher than the read voltage, and in this case the selected memory cell may be referred to as an off cell. In contrast, the selected memory cell may be turned on when the threshold voltage of the selected memory cell is lower than the read voltage, and in this case the selected memory cell may be referred to as an on cell. The cell current ICL may be relatively small in case of the off cell, and the cell current ICL may be relatively large in case of the on cell.

A leakage current ILK may occur, which flows through a parasitic resistance Rp between the bitline BL and the sink node NSK. According to Kirchhoff's current law, the bitline current IBL is the sum of the cell current ICL and the leakage current ILK.

The sense amplifier SA may be connected to the sensing node NS and the data stored in the selected memory cell may be sensed using the sense amplifier SA. An example of the sense amplifier SA will be described below with reference to FIG. 23.

Figure 21:
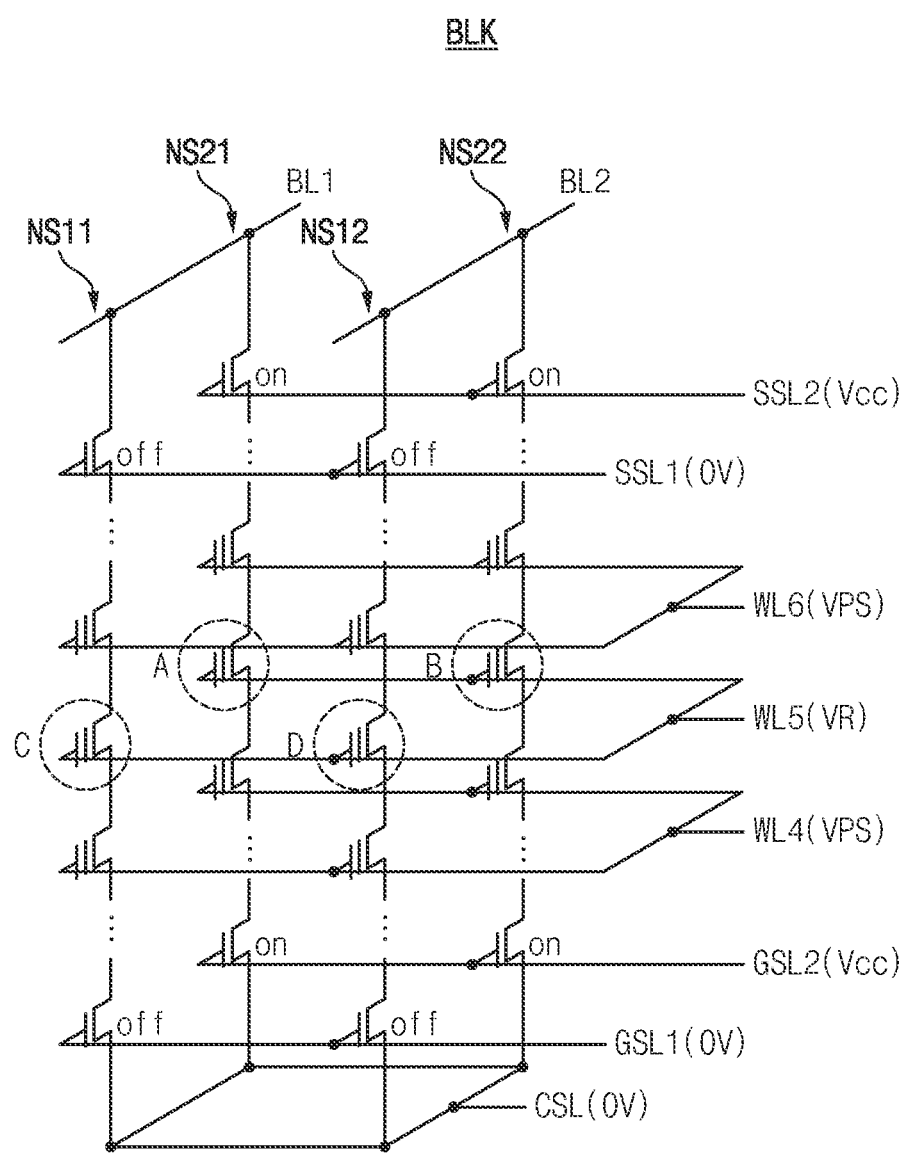
FIG. 21 is a circuit diagram illustrating a read bias condition of a nonvolatile memory device according to example embodiments.

FIG. 21 is a circuit diagram illustrating a read bias condition of a nonvolatile memory device according to example embodiments.

For convenience of description, NAND strings NS11 and NS21 connected to a first bitline BL1 and NAND strings NS12 and NS22 connected to a second bitline BL2 are illustrated in FIG. 21.

The first bitline BL1 and the second bitline BL2 may be pre-charged with a precharge voltage (e.g., 0.5 V). During a read operation, if NAND strings NS21 and NS22 are selected, a voltage of 0 V may be applied to the first string selection line SSL1 and a power supply voltage Vcc may be applied to the second string selection line SSL2. Furthermore, the voltage of 0 V may be applied to a first ground selection line GSL1 and the power supply voltage Vcc may be applied to a second ground selection line GSL2. A read voltage VR may be applied to a selected wordline (e.g., WL5) and a read pass voltage VPS may be applied to unselected wordlines (e.g., WL4 and WL6).

In this exemplary read bias condition, the drain voltage of selected memory cells A and B may be, for example, 0.5 V and the source voltage of selected memory cells A and B may be, for example, 0 V. In addition, the read voltage VR is applied to gates of the selected memory cells A and B. Furthermore, a read operation for verifying data stored at a memory cell may be performed while changing a voltage level of the read voltage VR. Channels of unselected NAND strings NS11 and NS12 including memory cells C and D are floated.

The voltage generator 560 of FIG. 17 may generate the read voltage VR and the read pass voltage VPS applied to the plurality of wordlines during the read operation using the voltage generator circuit CVG. That is, the decrease in the cell current at a low temperature may be compensated for, by applying the wordline voltages VR and VPS having CTAT characteristics to the wordlines.

Figure 22:
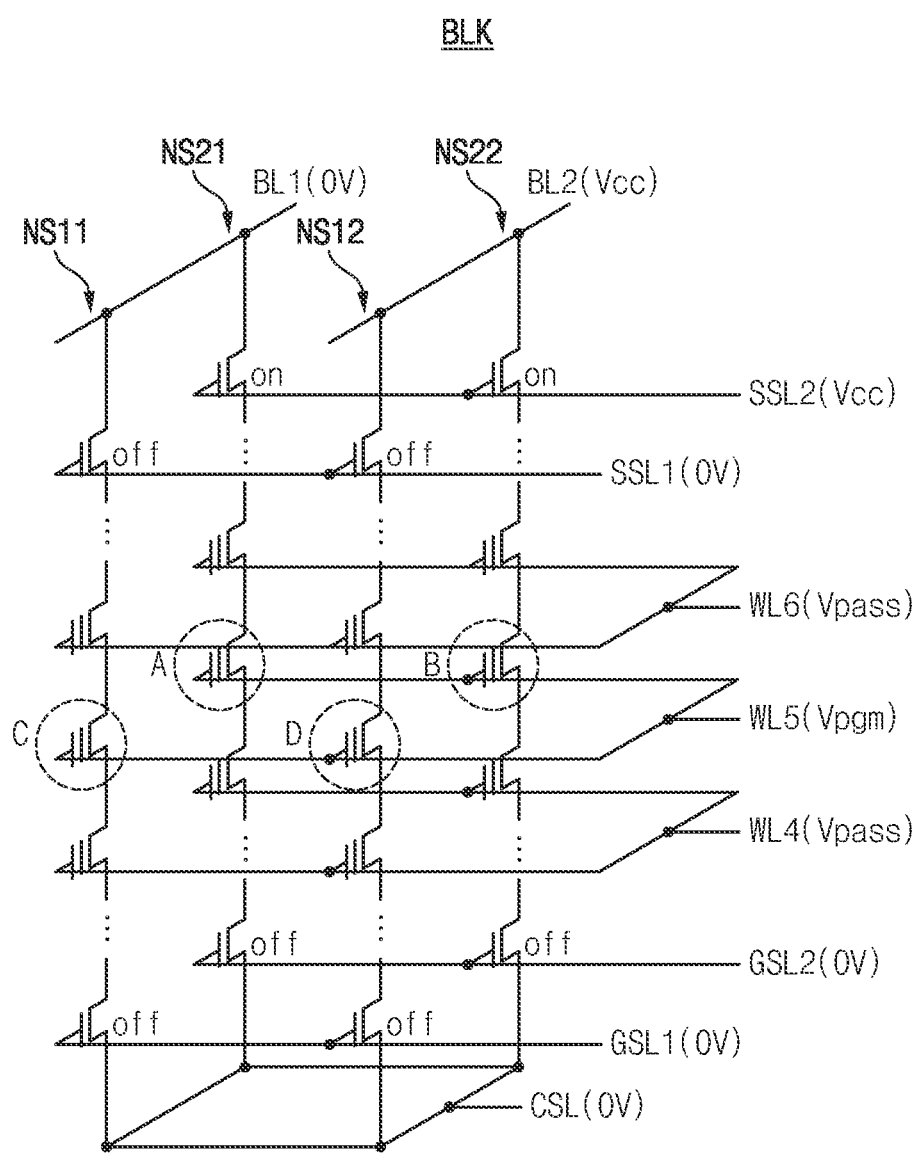
FIG. 22 is a circuit diagram illustrating a program bias condition of a nonvolatile memory device according to example embodiments.

FIG. 22 is a circuit diagram illustrating a program bias condition of a nonvolatile memory device according to example embodiments.

For convenience of description, NAND strings NS11 and NS21 connected to a first bitline BL1 and NAND strings NS12 and NS22 connected to a second bitline BL2 are illustrated in FIG. 22.

The first bitline BL1 may be a program bitline to which a program permission voltage (e.g., 0 V) is applied, and the second bitline BL2 may be a program inhibition bitline to which a program inhibition voltage such as a power supply voltage Vcc is applied. If the NAND string NS21 among the NAND strings NS11 and NS21 is selected, during a program operation, a voltage of 0 V may be applied to a first string selection line SSL1, and the power supply voltage Vcc may be applied to a second string selection line SSL2.

The voltage of 0 V may be applied to ground selection lines GSL1 and GSL2. Furthermore, a voltage (e.g., Vcc) higher than 0 V may be applied to a common source line CSL. A program voltage Vpgm (e.g., 18 V) may be applied to a selected wordline (e.g., WL5) and a pass voltage Vpass (e.g., 8 V) may be applied to unselected wordlines (e.g., WL4 and WL6).

Under the program bias condition, the program voltage Vpgm of 18V may be applied to a gate of a memory cell A having a channel voltage of 0 V. Since a strong electric field is formed between the gate and a channel of the memory cell A, the memory cell A may be programmed. However, since respective channels of memory cells C and D are in a floating state, channel voltages thereof may be boosted up to, for example, about 8 V, and thus, the memory cells C and D may not be programmed. The memory cell B may not be programmed because a weak electric field is formed between the gate of the memory cell B and the channel.

The voltage generator 560 of FIG. 17 may generate the program voltage Vpgm and the program pass voltage Vpass applied to the plurality of wordlines during the program operation using the voltage generator circuit CVG. That is, the decrease in the cell current at a low temperature may be compensated for, by applying the wordline voltages Vpgm and Vpass having the CTAT characteristic to the wordlines.

Figure 23:
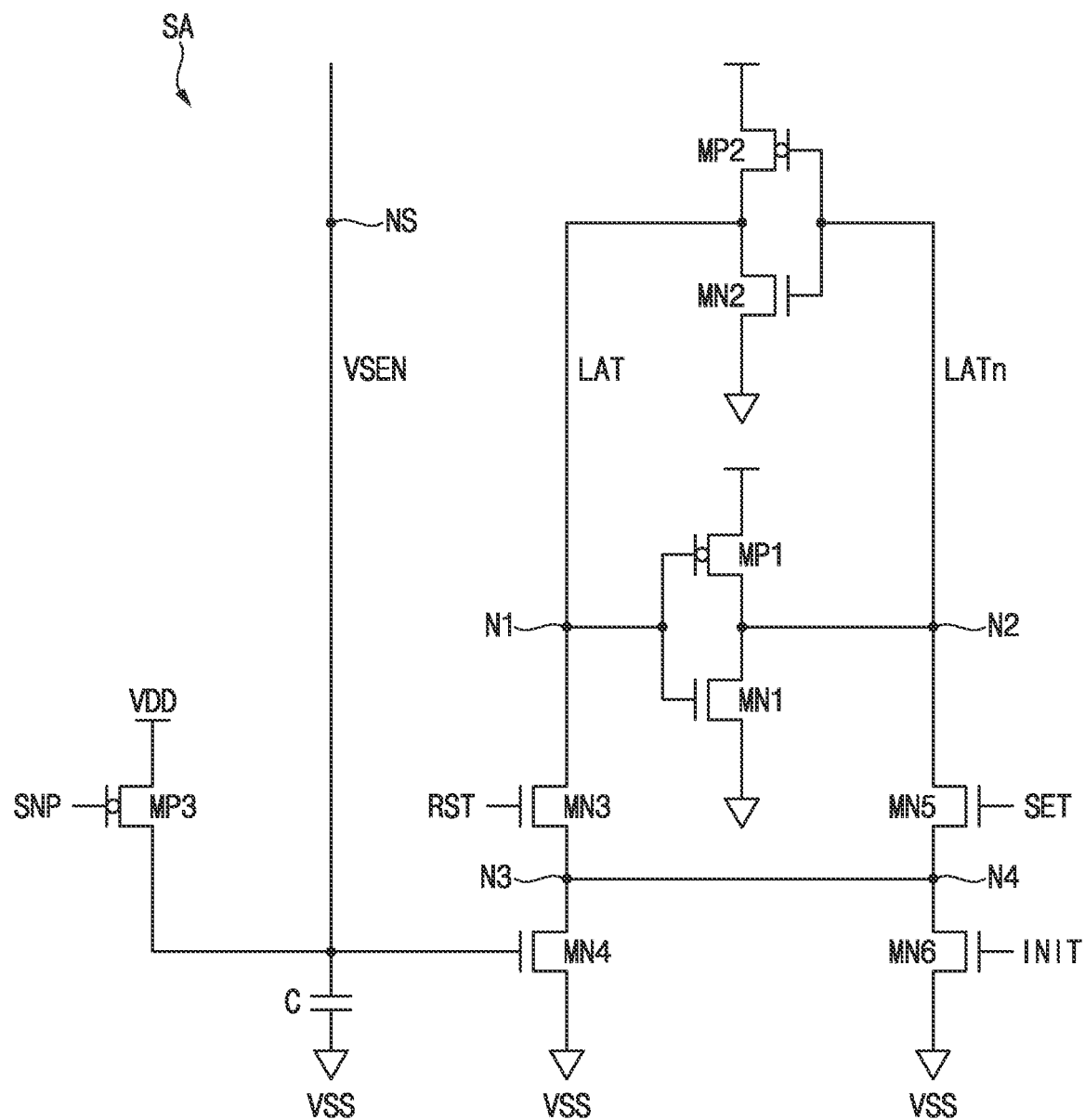
FIG. 23 is a circuit diagram illustrating an example of a sense amplifier included in a nonvolatile memory device according to example embodiments.

FIG. 23 is a circuit diagram illustrating an embodiment of a sense amplifier included in a nonvolatile memory device according to example embodiments.

Referring to FIG. 23, a sense amplifier SA may include N-type metal oxide semiconductor (NMOS) transistors MN1~MN6 and P-type metal oxide semiconductor (PMOS) transistors MP1~MN3. The configuration is provided as an example and example embodiments are not limited thereto. The sense amplifier included in the nonvolatile memory device according to example embodiments may be implemented with various configurations.

The PMOS transistor MP1 and the NMOS transistor MN1 may form a first inverter and the PMOS transistor MP2 and the NMOS transistor MN2 may form a second inverter. The input of the first inverter MP1 and MN1 may be connected to a first node N1 and the output of the first inverter MP1 and MN1 may be connected to a second node N2. In contrast, input of the second inverter MP2 and MN2 may be connected to the second node N2 and the output of the second inverter MP2 and MN2 may be connected to the first node N1. Accordingly the first inverter MP1 and MN1 and the second inverter MP2 and MN2 may form a single latch that generates a latch signal LAT through the first node N1 and generates an inverted latch signal LATn through the second node N2.

The NMOS transistor MN3 may electrically connect the first node N1 and the third node N3 based on a reset signal RST, and the NMOS transistor MN4 may electrically connect the third node N3 and the ground voltage VSS based on a sensing voltage VSEN at the sensing node NS.

The NMOS transistor MN5 may electrically connect the second node N2 and the fourth node N4 based on a set signal SET, and the NMOS transistor MN6 may electrically connect the fourth node N4 and the ground voltage VSS based on an initialization signal INIT. The PMOS transistor MP3 may pull up the sensing node NS to the power supply voltage VDD based on a pull up signal SNP.

The read operation may be implemented by a voltage sensing scheme or a current sensing scheme. The voltage of the bitline BL may be developed to the sensing node NS during the develop period while the precharge transistor MT1 is turned off according to the voltage sensing scheme. The voltage of the bitline BL may be developed to the sensing node NS during the develop period while the precharge transistor MT1 is turned on according to the current sensing scheme. An example current sensing scheme is described with reference to FIG. 24, but example embodiments are not limited thereto.

Figure 24:
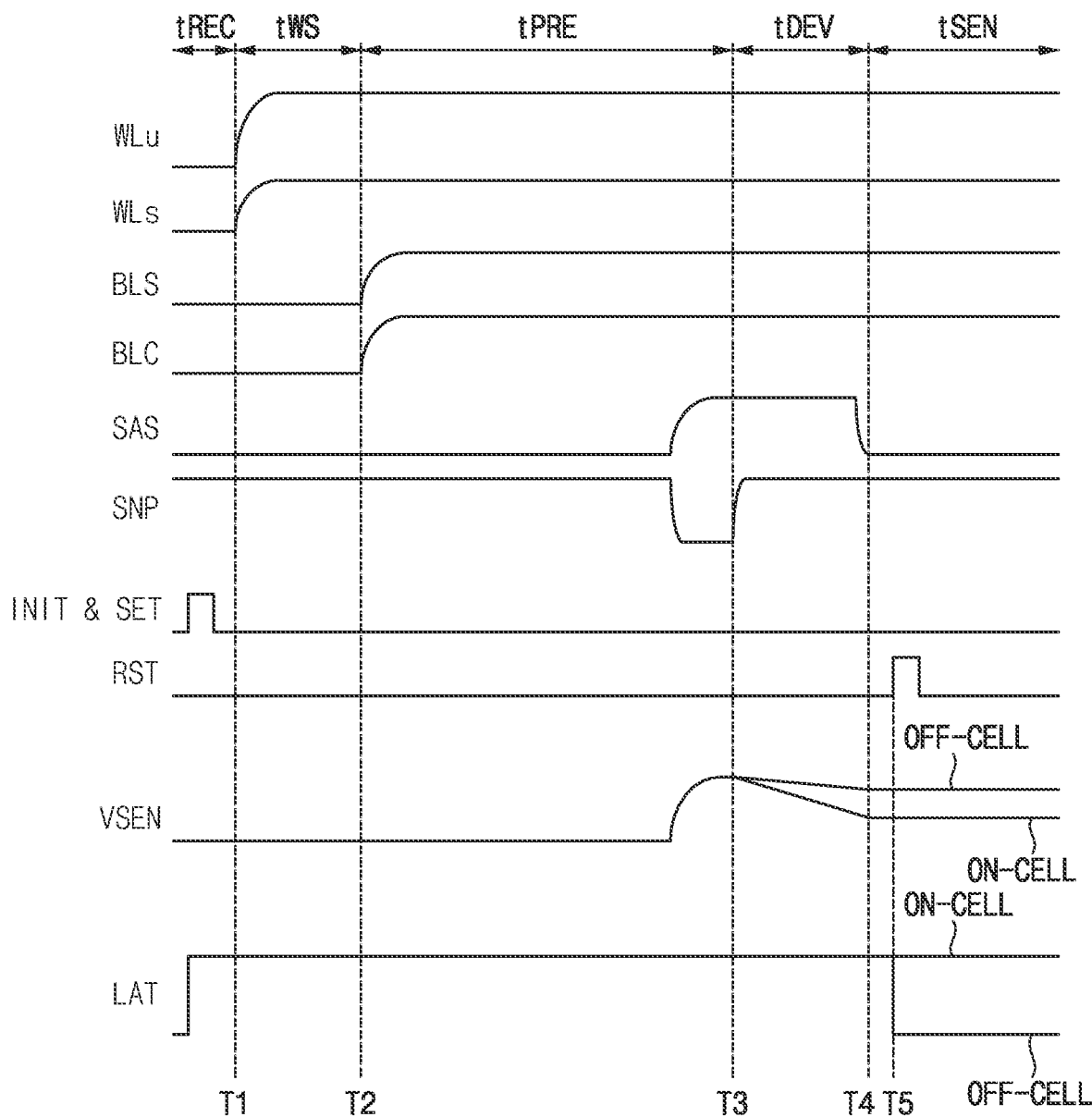
FIG. 24 is a timing diagram illustrating an operation of a nonvolatile memory device including the sense amplifier of FIG. 23, according to example embodiments.

FIG. 24 is a timing diagram illustrating an operation of a nonvolatile memory device including the sense amplifier of FIG. 23, according to example embodiments.

FIG. 24 illustrates operations during a recovery period tREC before time T1 for a read operation, a wordline setup period tWS between times T1 and T2, and a precharge period tPRE between times T2 and T3, a development period tDEV between the times T3 to T4, and a sensing period tSEN after the time T4.

Referring to FIGS. 20, 23 and 24, during the recovery period tREC, the initialization signal INIT and the set signal SET may be activated, the second node N2 and the fourth node N4 may be pulled down to the ground voltage VSS and the latch signal LAT may be initialized to a logic high level.

At time point T1, a read voltage may be applied to a selected wordline WLs to which a selected memory cell is connected, and a pass voltage may be applied to unselected wordlines WLu to which unselected memory cells are connected.

At time point T2, the bitline selection signal BLS and the precharge signal BLC may be activated. Accordingly the bitline selection transistor MT2 and the precharge transistor MT1 may be turned on to generate the bitline current IBL during the precharge period tPRE and the develop period tDEV.

The develop signal SAS may be deactivated and the develop transistor MT3 may be turned off during the wordline setup period tWS and the precharge period tPRE. In some example embodiments, as illustrated in FIG. 24, the develop signal SAS may be activated before the end of the precharge period tPRE, according to the configuration of the sense amplifier SA.

The pull up signal SNP may be activated to the logic low level in synchronization with the develop signal SAS being activated to the logic high level, and the pull up signal may be deactivated to the logic high level again at the time point T3. Accordingly the sensing voltage VSEN at the sensing node NS may be pulled up temporarily to the power supply voltage VDD and may start being developed at the time point T4 depending on the voltage of the bitline BL. As illustrated in FIG. 24, the sensing voltage VSEN may slowly decrease in case of the off cell due to the relatively small cell current ICL and the sensing voltage VSEN may rapidly decrease in case of the on cell due to the relatively large cell current ICL.

During the sensing period tSEN, for example at the time point T5, the reset signal RST may be activated to electrically connect the first node N1 and the third node N3. In case of the selected memory cell being the off cell, the NMOS transistor MN4 may be turned on because the sensing voltage VSEN is higher than the threshold voltage of the NMOS transistor MN4 and the latch signal LAT at the first node N1 may transition from the logic high level to the logic low level. In contrast, in case of the selected memory cell being the on cell, the NMOS transistor MN4 may be turned off because the sensing voltage VSEN is lower than the threshold voltage of the NMOS transistor MN4 and the latch signal LAT at the first node N1 may maintain the initialized logic high level.

FIGS. 25 through 28 are diagrams illustrating a precharge time in a nonvolatile memory device according to example embodiments.

Figure 25:
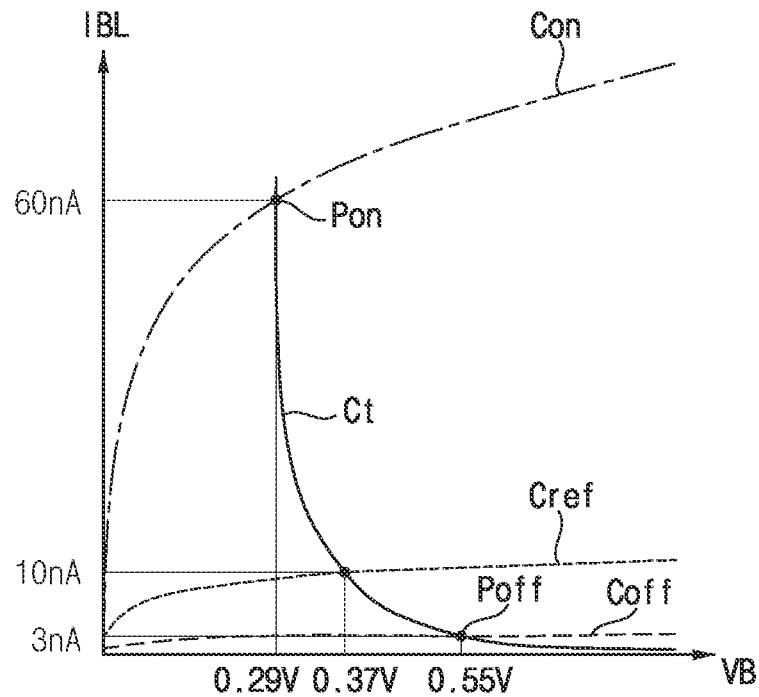
FIGS. 25 through 28 are diagrams illustrating a precharge time in a nonvolatile memory device according to example embodiments.
Figure 26:
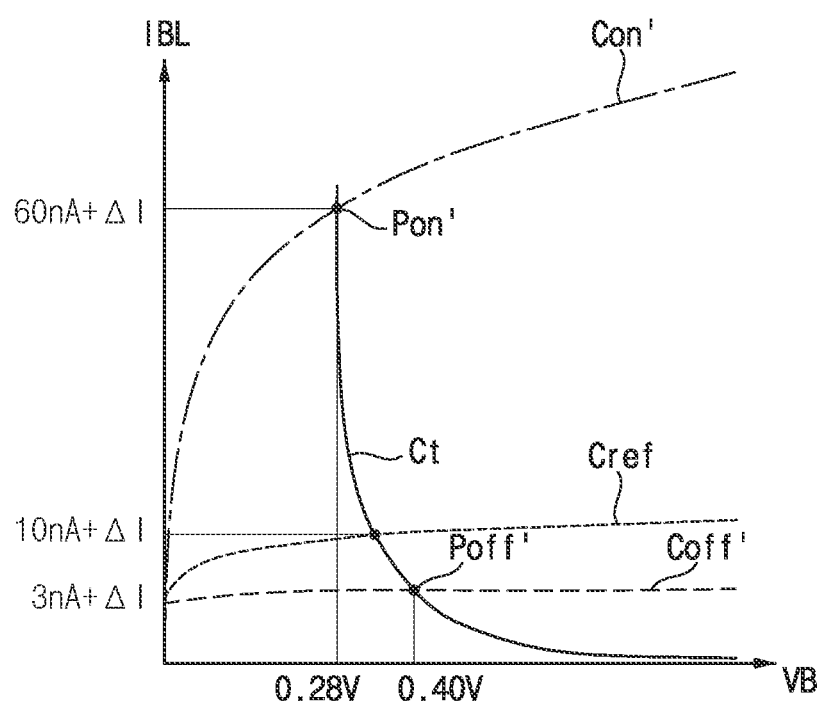
Figure 27:
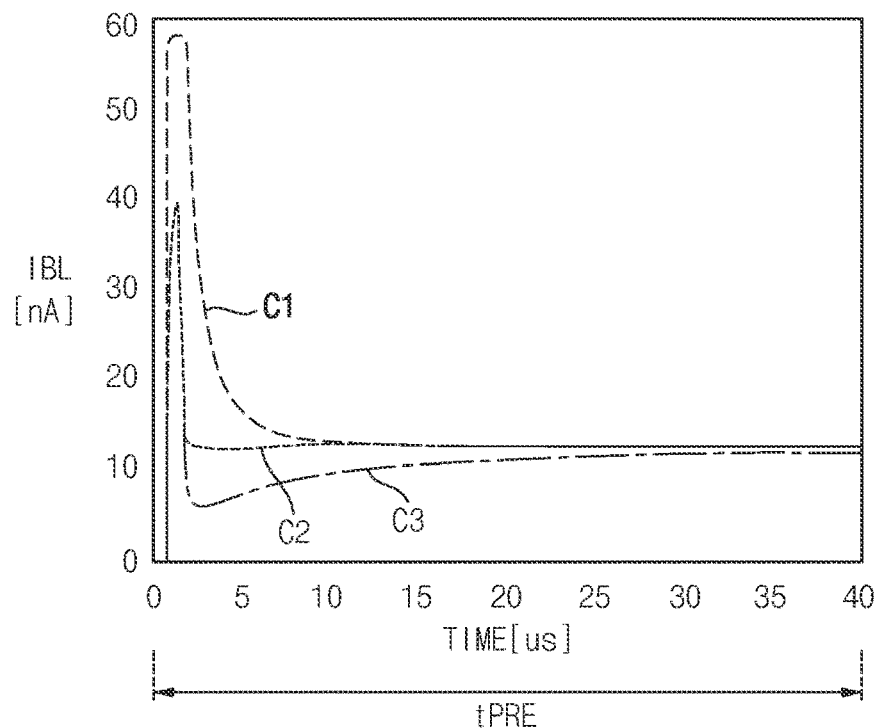
Figure 28:
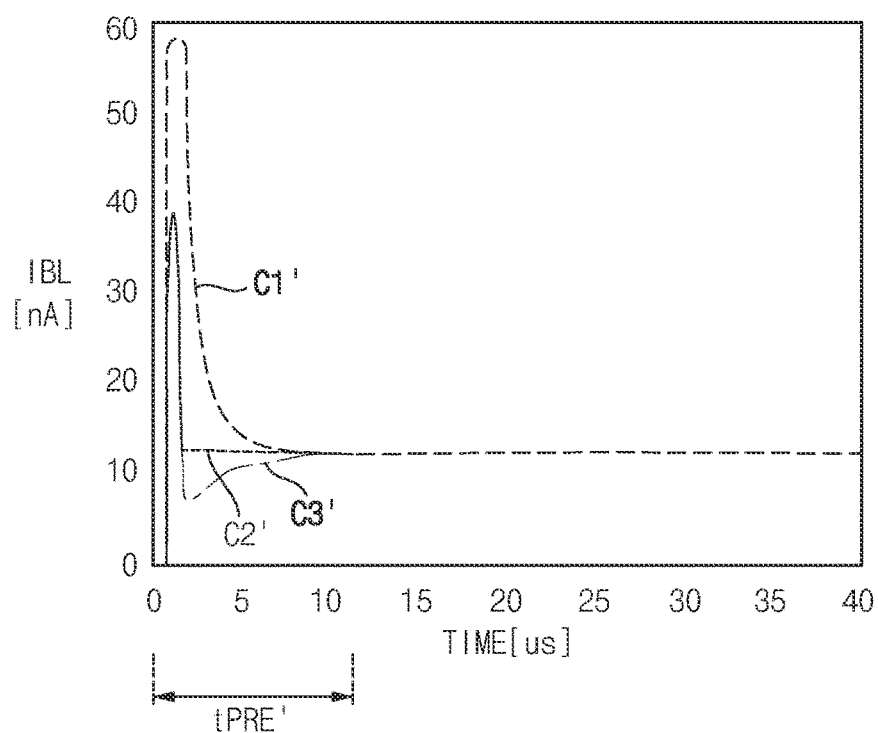

FIGS. 25 and 27 illustrate an example in which the bitline current IBL is relatively small and, FIGS. 26 and 28 illustrate an example in which the bitline current IBL is relatively large.

In FIGS. 25 and 26, Ct indicates a current-voltage characteristics of the bitline selection transistor MT2 in FIG. 20, Con and Con' indicate a relation between the bitline current IBL and the bitline voltage VB in case of the selected memory cell being the on cell, Coff and Coff' indicate a relation between the bitline current IBL and the bitline voltage VB in case of the selected memory cell being the off cell, Cref indicates a case of a reference cell such that the programmed state of the selected memory cell is to generate the sensing voltage VSEN that is the same as the threshold voltage of the NMOS transistor MN4 in FIG. 23.

The bitline current IBL and the bitline voltage VB of the on cell and the off cell may be determined by the cross points Pon, Pon', Poff and Poff' as illustrated in FIGS. 10A and 10B. For example, the bitline current IBL of the on cell, the reference cell and the off cell may be 3 nA (nano Ampere), 10 nA and 60 nA, and the bitline voltage VB may 0.29V, 0.37V and 0.55V, respectively.

As illustrated in FIG. 26, when the bitline current IBL is relatively large, the bitline voltage VB corresponding to the on cell may slightly decrease from 0.29V to 0.28V, but the bitline voltage VB corresponding to the off cell may significantly decrease from 0.55V to 0.40V.

FIGS. 27 and 28 illustrate changes of the bitline current IBL over time. C1 and C1' indicates the cases of the selected memory cell being the on cell, C2 and C2' indicates the cases of the selected memory cell being the reference cell, and C3 and C3' indicates the cases of the selected memory cell being the off cell.

By increasing the bitline current IBL, and the time for stabilizing the bitline current IBL may decrease as illustrated in FIGS. 27 and 28. Accordingly the time interval of the precharge period tPRE' in case of the relatively-great bitline current IBL may be reduced in comparison with the time interval of the precharge period tPRE in case of the relatively-small bitline current IBL.

Figure 29:
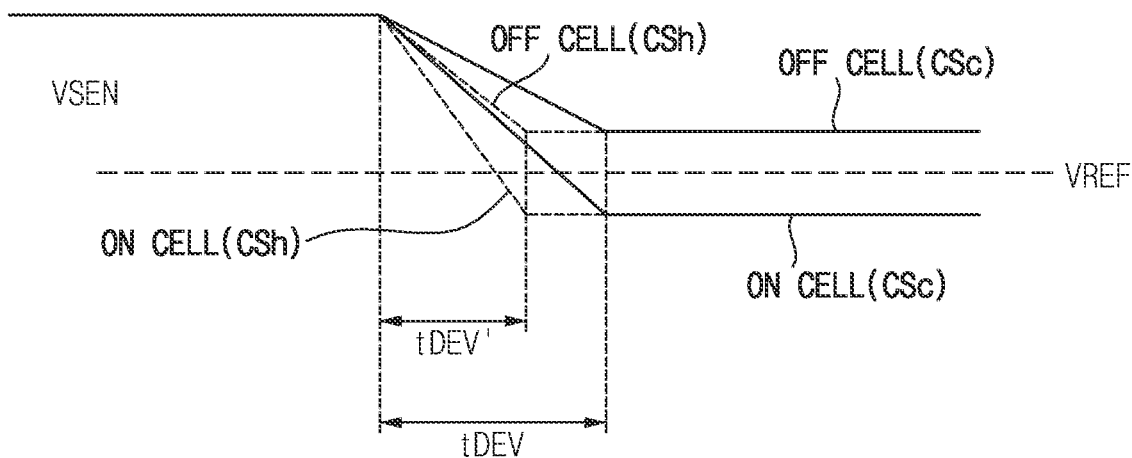
FIG. 29 is a diagram illustrating reduction of a develop time in a nonvolatile memory device according to example embodiments.

FIG. 29 is a diagram illustrating reduction of a develop time in a nonvolatile memory device according to example embodiments.

FIG. 29 shows a case where the precharge voltage VDD of FIG. 20 is kept constant regardless of the operation temperature To. In general, the operation voltage such as the precharge voltage may be maintained constant regardless of the operation temperature To using a bandgap reference circuit.

In FIG. 29, CSc represents the sensing voltage VSEN at a relatively low operation temperature To, and CSh represents the sensing voltage VSEN at a relatively high operation temperature To. For convenience of illustration and description, a case in which the sensing voltage VSEN develops at the same level is illustrated in FIG. 29 as an example. VREF of FIG. 29 represents the level of the sensing voltage VSEN corresponding to the transition boundary of the latch signal LAT at time T5 of FIGS. 23 and 24.

As shown in FIG. 29, the development period tDEV' required in the case of a relatively high operation temperature To may be shortened compared to the development period tDEV required in the case of a relatively low operation temperature To.

Figure 30:
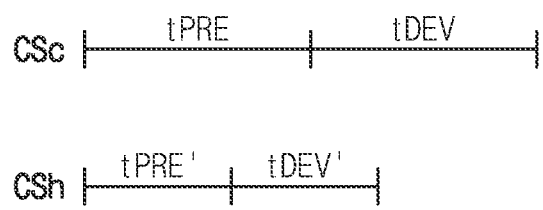
FIG. 30 is a diagram illustrating reduction of a read time in a nonvolatile memory device according to example embodiments.

FIG. 30 is a diagram illustrating reduction of a read time in a nonvolatile memory device according to example embodiments.

FIG. 30 illustrates a precharge period tPRE and a develop period tDEV required in a case CSc of a relatively low operation temperature To and in a case CSh of a relatively high operation temperature To. The aforementioned recovery period tREC, wordline setup period tWS and sensing period tSEN are omitted in FIG. 30.

According to example embodiments, the precharge voltage VDD of FIG. 20 applied to the plurality of bitlines during a read operation may be generated using the voltage generator circuit CGV. That is, the decrease in the bitline current IBL at a low temperature may be compensated for by applying the wordline voltages VR and VPS having the CTAT characteristic to the wordlines. By compensating for the decrease in the bitline current IBL, the precharge period tPRE and the develop period tDEV required at a relatively low operation temperature To may be shortened.

The smaller the deviation of the bitline current IBL, the easier it is to optimize the operating conditions of the page buffer and the better the sensing performance of the page buffer. As a result, the read time of the nonvolatile memory device may be reduced and the performance of the nonvolatile memory device may be improved.

Figure 31:
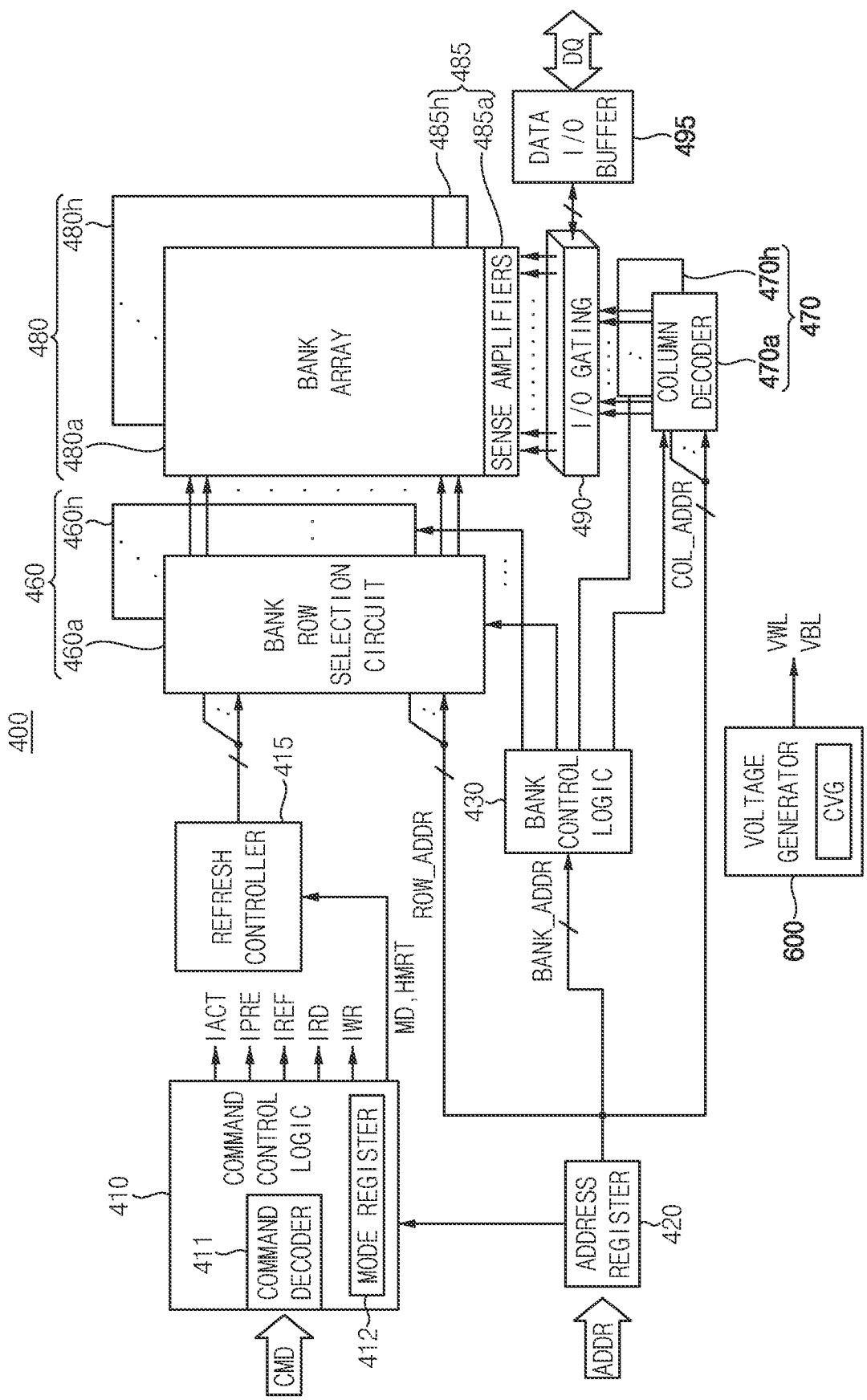
FIG. 31 is a block diagram illustrating a semiconductor memory device according to example embodiments.

FIG. 31 is a block diagram illustrating a semiconductor memory device according to example embodiments.

Referring to FIG. 31, a semiconductor memory device 400 may include a command control logic 410, an address register 420, a bank control logic 430, a row selection circuit 460 (or row decoder), a column decoder 470, a memory cell array 480, a sense amplifier unit 485, an input/output (I/O) gating circuit 490, a data input/output (I/O) buffer 495, a refresh controller 415, and a voltage generator 600.

The memory cell array 480 may include a plurality of bank arrays 480a~480h. The row selection circuit 460 may include a plurality of bank row selection circuits 460a~460h respectively coupled to the bank arrays 480a~480h. The column decoder 470 may include a plurality of bank column decoders 470a~470h respectively coupled to the bank arrays 480a~480h. The sense amplifier unit 485 may include a plurality of bank sense amplifiers 485a~485h respectively coupled to the bank arrays 480a~480h.

The address register 420 may receive an address ADDR including a bank address BANK_ADDR, a row address ROW_ADDR, and a column address COL_ADDR from the memory controller 200. The address register 420 may provide the received bank address BANK_ADDR to the bank control logic 430, may provide the received row address ROW_ADDR to the row selection circuit 460, and may provide the received column address COL_ADDR to the column decoder 470.

The bank control logic 430 may generate bank control signals in response to the bank address BANK_ADDR. One of the bank row selection circuits 460a~460h corresponding to the bank address BANK_ADDR may be activated in response to the bank control signals, and one of the bank column decoders 470a~470h corresponding to the bank address BANK_ADDR may be activated in response to the bank control signals.

The row address ROW_ADDR from the address register 420 may be applied to the bank row selection circuits 460a~460h. The activated one of the bank row selection circuits 460a~460h may decode the row address ROW_ADDR, and may activate a wordline corresponding to the row address ROW_ADDR. For example, the activated bank row selection circuit 460 may apply a wordline driving voltage to the wordline corresponding to the row address ROW_ADDR.

The column decoder 470 may include a column address latch. The column address latch may receive the column address COL_ADDR from the address register 420, and may temporarily store the received column address COL_ADDR. In some exemplary embodiments, in a burst mode, the column address latch may generate column addresses that increment from the received column address COL_ADDR. The column address latch may apply the temporarily stored or generated column address to the bank column decoders 470a~470h.

The activated one of the bank column decoders 470a~470h may decode the column address COL_ADDR, and may control the I/O gating circuit 490 in order to output data corresponding to the column address COL_ADDR.

The I/O gating circuit 490 may include circuitry for gating input/output data. The I/O gating circuit 490 may further include read data latches for storing data that is output from the bank arrays 480a~480h, and write drivers for writing data to the bank arrays 480a~480h.

Data to be read from one bank array of the bank arrays 480a~480h may be sensed by one of the bank sense amplifiers 485a~485h coupled to the one bank array from which the data is to be read, and may be stored in the read data latches. The data stored in the read data latches may be provided to the memory controller 200 via the data I/O buffer 495. Data DQ to be written in one bank array of the bank arrays 480a~480h may be provided to the data I/O buffer 495 from the memory controller 200. The write driver may write the data DQ in one bank array of the bank arrays 480a~480h.

The command control logic 410 may control operations of the semiconductor memory device 400. For example, the command control logic 410 may generate control signals for the semiconductor memory device 400 in order to perform a write operation, a read operation, or a refresh operation. The command control logic 410 may generate internal command signals such as an active signal IACT, a precharge signal IPRE, a refresh signal IREF, a read signal IRD, a write signal IWR, etc., based on commands CMD transferred from a memory controller. The command control logic 410 may include a command decoder 411 that decodes the commands CMD received from the memory controller 200 and a mode register set 412 that sets an operation mode of the semiconductor memory device 400.

Although FIG. 31 illustrates the command control logic 410 and the address register 420 as being distinct from each other, in some embodiments, the command control logic 410 and the address register 420 may be implemented as a single integrated circuit. In addition, although FIG. 31 illustrates the command CMD and the address ADDR as being provided as distinct signals, in some embodiments, the command CMD and the address ADDR may be provided as a combined signal, e.g., as specified by DDR5, HBM and LPDDR5 standards.

The voltage generator 600 may include one or more voltage generator circuits CVG as described above. The voltage generator 600 may generate the wordline voltage VWL and/or the bitline voltage VBL using the voltage generation circuits CVG.

Figure 32:
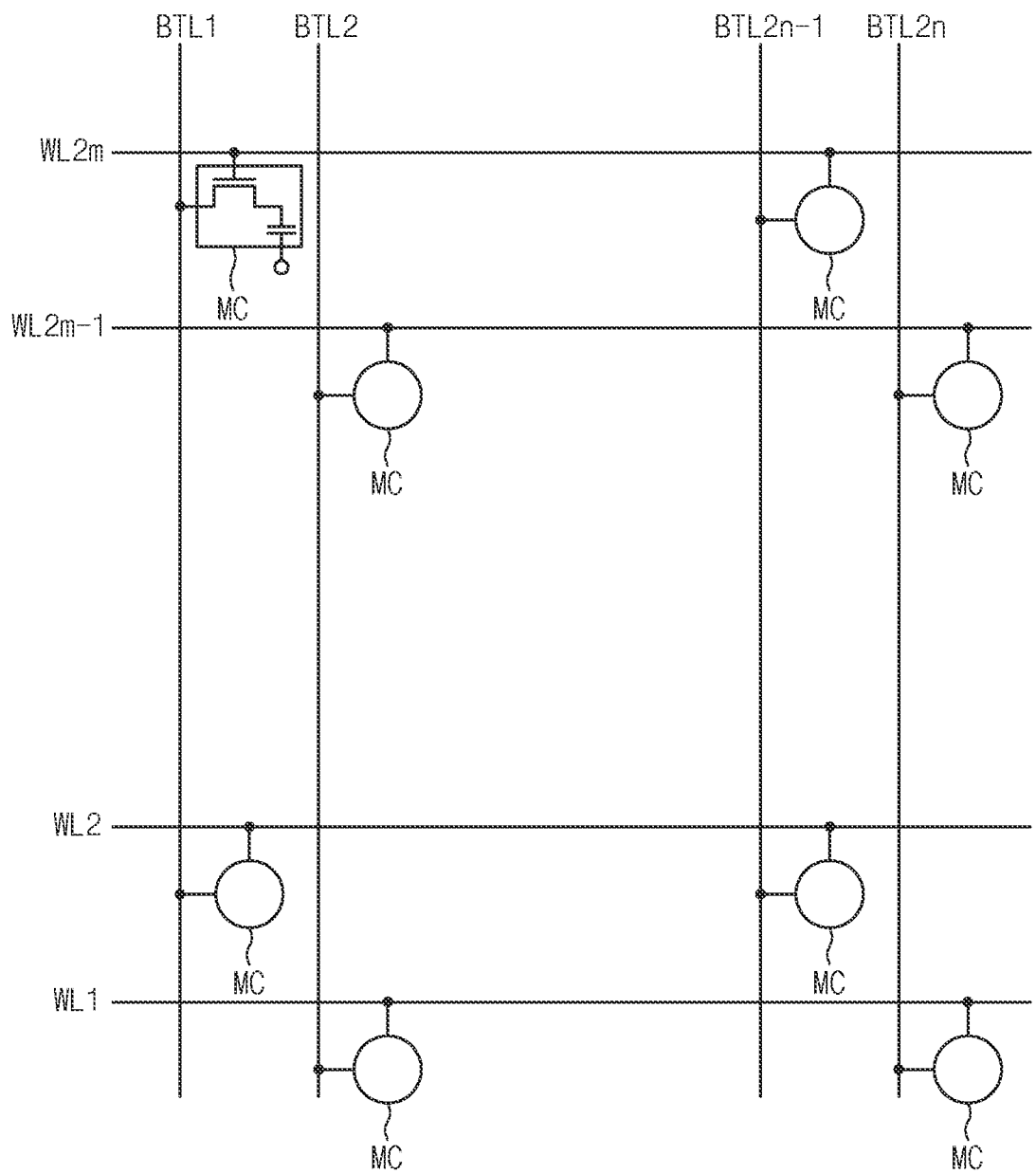
FIG. 32 is a diagram illustrating an example of a bank array included in the semiconductor memory device of FIG. 31, according to example embodiments.

FIG. 32 is a diagram illustrating an example of a bank array included in the semiconductor memory device of FIG. 31.

Referring to FIG. 32, a bank array 310 includes a plurality of word-lines WL1~WL2m (where m is a natural number greater than two), a plurality of bit-lines BTL1~BTL2n (where n is a natural number greater than two), and a plurality of memory cells MCs disposed near intersections between the word-lines WL1~WL2m and the bit-lines BTL1~BTL2n. In some example embodiments, each of the plurality of memory cells MCs may include a DRAM cell structure as illustrated in FIG. 32. The plurality of word-lines WL1~WL2m to which the plurality of memory cells MCs are connected may be referred to as rows of the bank array 310 and the plurality of bit-lines BL1~BL3n to which the plurality of memory cells MCs are connected may be referred to as columns of the bank array 310.

Figure 33:
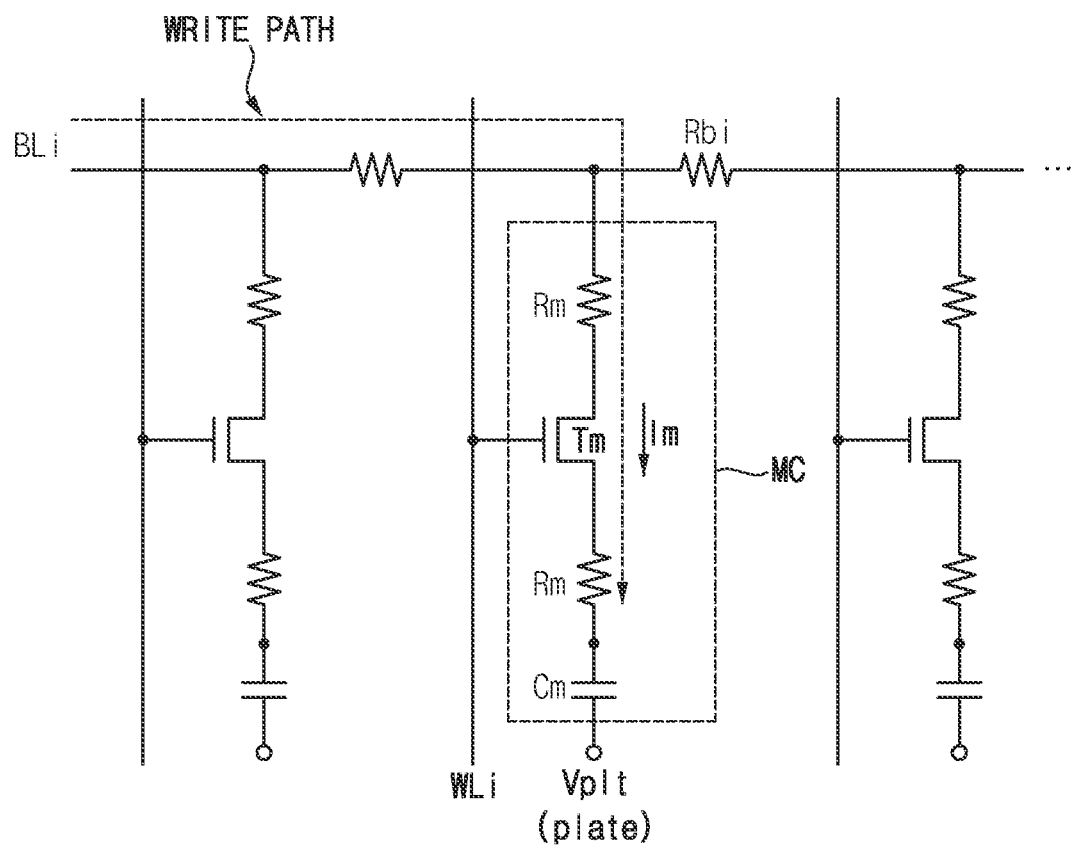
FIG. 33 is a diagram illustrating a portion of a semiconductor memory device according to example embodiments.
Figure 34:
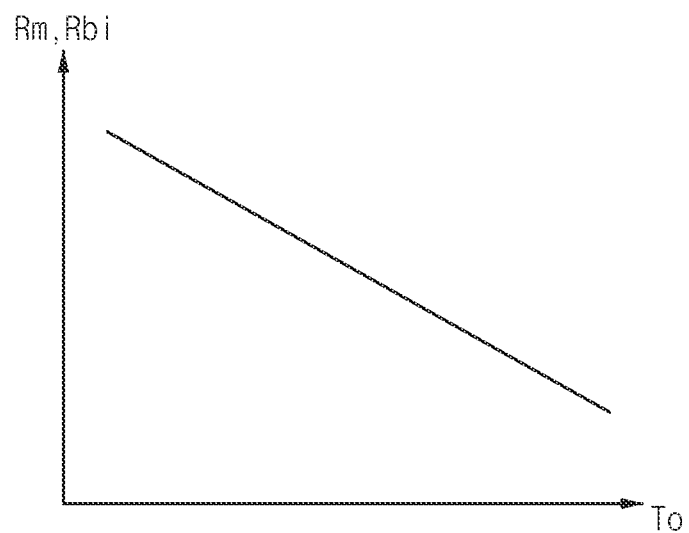
FIGS. 34 and 35 are diagrams illustrating operation characteristics of a semiconductor memory device according to example embodiments.
Figure 35:
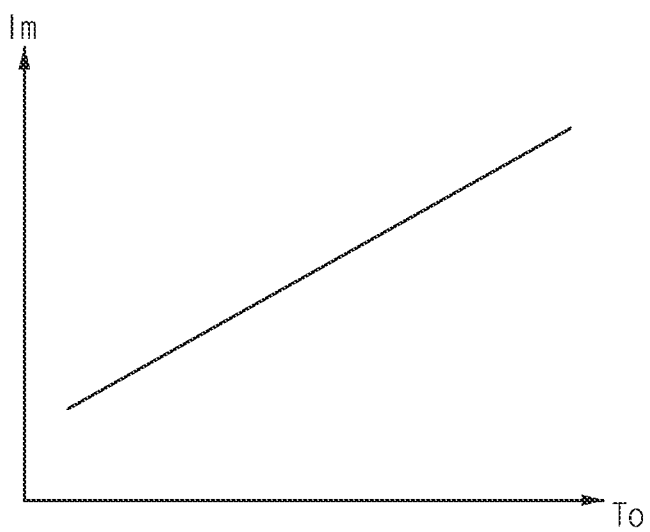

FIG. 33 is a diagram illustrating a portion of a semiconductor memory device according to example embodiments, and FIGS. 34 and 35 are diagrams illustrating operation characteristics of a semiconductor memory device according to example embodiments.

Referring to FIG. 33, a data write path WRITE PATH includes a path through which data of the bitline BLi is stored in the memory cell capacitor Cm through the memory cell transistor Tm after the selected wordline WLi is enabled. As the contact size of the memory cell capacitor Cm decreases as the DRAM manufacturing process is miniaturized, the contact resistance Rm increases. Also, the bitline resistance Rbi is increased by the narrowly patterned bitline BLi.

As shown in FIG. 34, as the operation temperature To decreases, the contact resistance Rm and the bitline resistance Rbi increase, and consequently, as shown in FIG. 35, the operation temperature To decreases. As the voltage increases, the cell current Im flowing through the memory cell transistor Tm decreases.

The voltage generator 600 of FIG. 31 may generate the selected wordline voltage applied to the selected wordline WLi during a write operation and a read operation using the voltage generator circuit CVG. That is, by applying the selected wordline voltage having the CTAT characteristic to the selected wordline, a decrease in cell current at a low temperature may be compensated for and speed of the write operation and the read operation may be improved.

The voltage generator 600 may generate a bitline voltage using the voltage generator circuit CVG during a write operation. That is, by applying the bitline voltage having the CTAT characteristic to the bitline, a decrease in cell current at a low temperature may be compensated for and the speed of the write operation may be improved.

Figure 36:
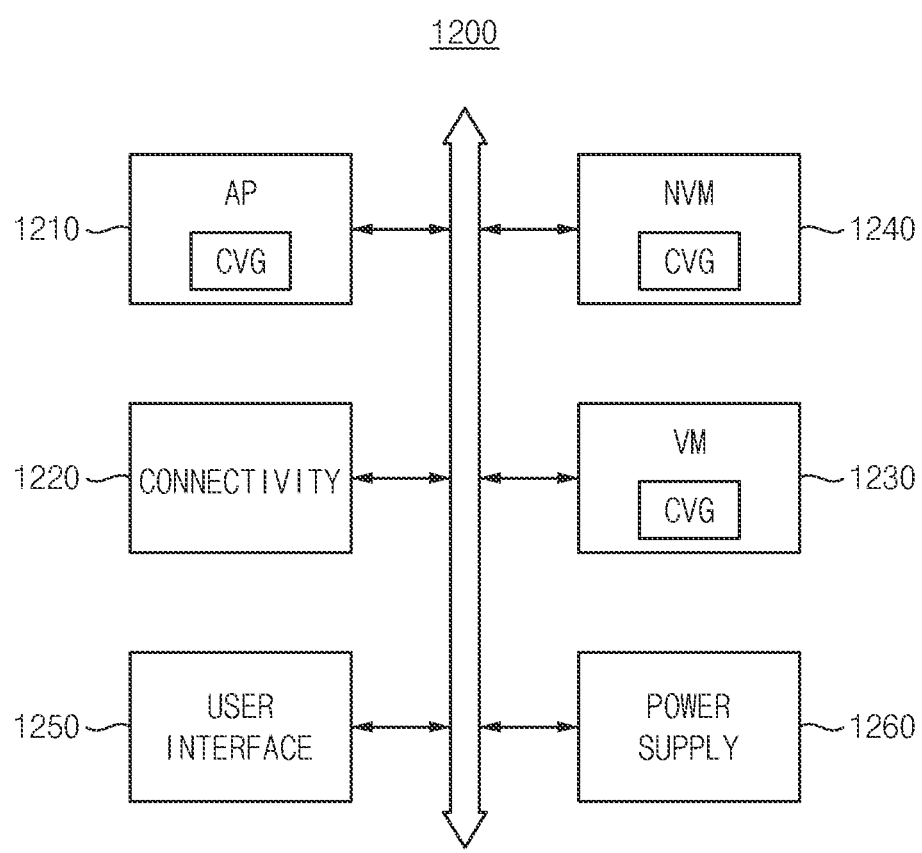
FIG. 36 is a block diagram illustrating a system according to example embodiments.

FIG. 36 is a block diagram illustrating a system according to example embodiments.

Referring to FIG. 36, a system 1200 includes an application processor (AP) 1210, a connectivity unit 1220, a volatile memory device (VM) 1230, a nonvolatile memory device (NVM) 1240, a user interface 1250, and a power supply 1260. In some example embodiments, the system 1200 may be, for example, a mobile phone, a smart phone, a personal digital assistant (PDA), a portable multimedia player (PMP), a digital camera, a music player, a portable game console, a navigation system, or another type of electronic device.

The application processor 1210 may execute applications, e.g., a web browser, a game application, a video player, etc. The connectivity unit 1220 may perform wired or wireless communication with an external device. The volatile memory device 1230 may store data processed by the application processor 1210 or may operate as a working memory. The nonvolatile memory device 1240 may store a boot image for booting the system 1200. The user interface 1250 may include at least one input device, such as a keypad, a touch screen, etc., and at least one output device, such as a speaker, a display device, etc. The power supply 1260 may supply a power supply voltage to the system 1200.

According to example embodiments, the application processor 1210, the memory device 1230, and/or the nonvolatile memory device 1240 may include one or more voltage generation circuits CVG as described above with reference to FIGS. 1 through 16. Performance of the system 1200 may be improved by implementing temperature compensation for compensating an applied voltage according to temperature characteristics of memory cells using voltage generator circuits CVG.

As described above, the voltage generation circuit according to example embodiments may generate the CTAT output voltage with enhanced linearity using the reference current having a constant magnitude irrelevant to the operation temperature. Through the CTAT output voltage with enhanced linearity, it is possible to reduce the operation variation due to the change in operation temperature of the semiconductor device such as the semiconductor memory device, and efficiently trim the operation variation of each device according to a manufacturing process. The performance of the semiconductor device may be improved and the low-voltage design of the semiconductor device may be promoted through the reduction of the operation deviation.

Various example embodiments herein may be applied to a memory device and systems including a memory device. For example, the various example embodiments may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an automotive device, etc.

The foregoing is illustrative of example embodiments and is not to be construed as limiting thereof. Although a few example embodiments have been described, those skilled in the art will readily appreciate that many modifications are possible in the example embodiments and such modifications are encompassed in the scope of the appended claims.

What is claimed is:

1. A voltage generation circuit comprising:
 a current generation circuit connected between an input voltage node and an output node that outputs a complementary to absolute temperature (CTAT) output voltage that decreases as an operation temperature increases, the current generation circuit configured to generate a reference current flowing through the output node, the reference current having a constant magnitude regardless of the operation temperature;
 a slope trimming circuit connected between the output node and an intermediate node, the slope trimming circuit configured to adjust a slope of the CTAT output voltage based on a first trimming code; and
 an offset trimming circuit connected between the intermediate node and a ground voltage node, the offset trimming circuit configured to adjust an offset voltage of the CTAT output voltage based on a second trimming code.

2. The voltage generation circuit of claim 1, wherein the offset voltage has a constant magnitude regardless of the operation temperature.

3. The voltage generation circuit of claim 1, wherein the current generation circuit includes:
 a first bias voltage generation circuit configured to generate a first bias voltage that increases as the operation temperature increases;
 a second bias voltage generation circuit configured to generate a second bias voltage that decreases as the operation temperature increases;
 a first current source connected between the input voltage node and the output node, the first current source configured to generate a first current based on the first bias voltage, the first current increasing as the operation temperature increases; and
 a second current source connected in parallel to the first current source between the input voltage node and the output node, the second current source configured to generate a second current based on the second bias voltage, the second current decreasing as the operation temperature increases.

4. The voltage generation circuit of claim 3, wherein the first current source includes:
a first P-type metal oxide semiconductor (PMOS) transistor including a gate electrode that receives the first bias voltage, a source electrode connected to the input voltage node and a drain electrode connected to the output node, and
wherein the second current source includes:
a second PMOS transistor including a gate electrode that receives the second bias voltage, a source electrode connected to the input voltage node and a drain electrode connected to the output node.

5. The voltage generation circuit of claim 1, wherein the slope trimming circuit includes:
a plurality of diode-connected transistors connected in parallel between the output node and the intermediate node; and
a plurality of switches connected between the output node and respective ones of the plurality of diode-connected transistors and being turned on based on respective bits of the first trimming code.

6. The voltage generation circuit of claim 5, wherein the plurality of diode-connected transistors are implemented with PMOS transistors, and at least two of the PMOS transistors have sizes different from each other.

7. The voltage generation circuit of claim 1, wherein the offset trimming circuit includes:
a plurality of resistors connected in series between the intermediate node and the ground voltage node; and
a plurality of switches connected in parallel with respective ones of the plurality of resistors and being turned on based on respective bits of the second trimming code.

8. The voltage generation circuit of claim 7, wherein at least two of the plurality of resistors have resistance values different from each other.

9. A semiconductor memory device comprising:
a memory cell array including a plurality of memory cells respectively connected to a plurality of wordlines and a plurality of bitlines; and
a voltage generator including a voltage generation circuit, the voltage generator configured to output voltages to drive the plurality of wordlines, the voltages being based on a complementary to absolute temperature (CTAT) output voltage that decreases as an operation temperature increases,
wherein the voltage generation circuit includes:
a current generation circuit connected between an input voltage node and an output node that outputs the CTAT output voltage, the current generation circuit configured to generate a reference current flowing through the output node, the reference current having a constant magnitude regardless of the operation temperature;
a slope trimming circuit connected between the output node and an intermediate node, the slope trimming circuit configured to adjust a slope of the CTAT output voltage based on a first trimming code; and
an offset trimming circuit connected between the intermediate node and a ground voltage node, the offset trimming circuit configured to adjust an offset voltage of the CTAT output voltage based on a second trimming code.

10. The semiconductor memory device of claim 9, wherein the semiconductor memory device is a NAND flash memory device.

11. The semiconductor memory device of claim 10, wherein the voltage generator is configured to generate, using the voltage generation circuit, a read voltage and a read pass voltage that are output to the plurality of wordlines during a read operation.

12. The semiconductor memory device of claim 10, wherein the voltage generator is configured to generate, using the voltage generation circuit, a program voltage and a program pass voltage that are output to the plurality of wordlines during a program operation.

13. The semiconductor memory device of claim 10, wherein the voltage generator is configured to generate, using the voltage generation circuit, a precharge voltage that is output to the plurality of bitlines during a read operation.

14. The semiconductor memory device of claim 9, wherein the semiconductor memory device is a dynamic random access memory (DRAM) device.

15. The semiconductor memory device of claim 14, wherein the voltage generator is configured to generate, using the voltage generation circuit, a selection wordline voltage that is output to a selected wordline of the plurality of wordlines during a write operation and a read operation.

16. The semiconductor memory device of claim 14, wherein the voltage generator is configured to generate, using the voltage generation circuit, a bitline voltage that is output to the plurality of bitlines during a read operation.

17. The semiconductor memory device of claim 9, further comprising:
a nonvolatile code storage configured to store the first trimming code and the second trimming code.

18. The semiconductor memory device of claim 17, wherein the first trimming code and the second trimming code are generated during a test process of the semiconductor memory device and stored in the nonvolatile code storage.

19. The semiconductor memory device of claim 9, wherein the offset voltage has a constant magnitude regardless of the operation temperature of the semiconductor memory device.

20. A voltage generation circuit comprising:
a first bias voltage generation circuit configured to generate a first bias voltage that increases as an operation temperature increases;
a second bias voltage generation circuit configured to generate a second bias voltage that decreases as the operation temperature increases;
a first current source connected between an input voltage node and an output node, the first current source configured to generate a first current based on the first bias voltage, the first current increasing as the operation temperature increases;
a second current source connected in parallel to the first current source between the input voltage node and the output node, the second current source configured to generate a second current based on the second bias voltage, the second current decreasing as the operation temperature increases;
a plurality of diode-connected transistors connected in parallel between the output node and an intermediate node;
a plurality of first switches connected between the output node and respective ones of the plurality of diode-connected transistors and being turned on based on respective bits of a first trimming code;
a plurality of resistors connected in series between the intermediate node and a ground voltage node; and a plurality of second switches connected in parallel with respective ones of the plurality of resistors and being turned on based on respective bits of a second trimming code.

* * * * *